(12) United States Patent
Yang et al.

(10) Patent No.: US 12,170,056 B2
(45) Date of Patent: *Dec. 17, 2024

(54) LIGHT EMITTING SUBSTRATE, DISPLAY APPARATUS, AND METHOD OF DRIVING LIGHT EMITTING SUBSTRATE

(71) Applicant: BOE Technology Group Co., Ltd., Beijing (CN)

(72) Inventors: Ming Yang, Beijing (CN); Qi Qi, Beijing (CN); Wanzhi Chen, Beijing (CN); Lubin Shi, Beijing (CN); Fuqiang Li, Beijing (CN); Fei Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/509,233

(22) Filed: Nov. 14, 2023

(65) Prior Publication Data

US 2024/0096271 A1 Mar. 21, 2024

Related U.S. Application Data

(63) Continuation of application No. 17/631,599, filed as application No. PCT/CN2021/079089 on Mar. 4, 2021, now Pat. No. 11,837,153.

(51) Int. Cl.
*G09G 3/32* (2016.01)
(52) U.S. Cl.
CPC ....... *G09G 3/32* (2013.01); *G09G 2300/0408* (2013.01); *G09G 2310/0202* (2013.01); *G09G 2310/0264* (2013.01)

(58) Field of Classification Search
CPC ............. G09G 3/32; G09G 2300/0408; G09G 2310/0202; G09G 2300/0426;
(Continued)

(56) References Cited

U.S. PATENT DOCUMENTS 8,933,433 B2 1/2015 Higginson et al.
2006/0139254 A1 6/2006 Hayakawa et al.
(Continued)

FOREIGN PATENT DOCUMENTS

| CN | 1717130 A | 1/2006 |
| CN | 101065794 A | 10/2007 |

(Continued)

OTHER PUBLICATIONS

International Search Report & Written Opinion mailed Dec. 9, 2021, regarding PCT/CN2021/079089.
(Continued)

*Primary Examiner* — Muhammad N Edun
(74) *Attorney, Agent, or Firm* — Intellectual Valley Law, P.C.

(57) ABSTRACT

A light emitting substrate is provided. The light emitting substrate includes a plurality of light emitting controlling units arranged in M rows and N columns, M is an integer equal to or greater than one, N is an integer equal to or greater than one, wherein a respective one of the plurality of light emitting controlling units includes a plurality of light emitting elements arranged in J rows and I columns, J being an integer equal to or greater than one, I being an integer equal to or greater than one, a i-th column of the I columns of light emitting elements includes J rows of light emitting elements, $1 \leq i \leq I$; (M×J) number of first voltage signal lines; and (M×J) number of groups of second voltage signal lines.

20 Claims, 10 Drawing Sheets

(58) Field of Classification Search
CPC ......... G09G 2310/0264; G09G 3/3426; G09G 2330/021; H01L 25/0753; H01L 33/62; G02F 1/133603; G02F 1/133605; G02F 1/133616; G09F 9/30
See application file for complete search history.

(56) References Cited

U.S. PATENT DOCUMENTS

| | | |
|---|---|---|
| 2007/0046603 A1 | 3/2007 | Smith et al. |
| 2015/0022513 A1 | 1/2015 | Kim |
| 2015/0294612 A1* | 10/2015 | Kim ................ G09G 3/3225 345/77 |
| 2017/0011676 A1* | 1/2017 | Wu ...................... G09G 3/32 |
| 2020/0052033 A1 | 2/2020 | Iguchi |
| 2020/0074917 A1* | 3/2020 | Li ..................... G09G 3/3426 |

FOREIGN PATENT DOCUMENTS

| | | |
|---|---|---|
| CN | 108469697 A | 8/2018 |
| CN | 110782806 A | 2/2020 |
| CN | 110867158 A | 3/2020 |
| CN | 210376949 U | 4/2020 |
| CN | 111129061 A | 5/2020 |
| CN | 111292634 A | 6/2020 |
| CN | 111863862 A | 10/2020 |
| EP | 3591415 A1 | 1/2020 |

OTHER PUBLICATIONS

Non-Final Office Action in the U.S. Appl. No. 17/631,599, dated Jun. 7, 2023.
Response to Non-Final Office Action in the U.S. Appl. No. 17/631,599, dated Aug. 22, 2023.
Notice of Allowance in the U.S. Appl. No. 17/631,599, dated Sep. 7, 2023.

* cited by examiner

LIGHT EMITTING SUBSTRATE, DISPLAY APPARATUS, AND METHOD OF DRIVING LIGHT EMITTING SUBSTRATE

CROSS-REFERENCE TO RELATED APPLICATION

This application is a continuation of U.S. application Ser. No. 17/631,599, filed Mar. 4, 2021, which is a national stage application under 35 U.S.C. § 371 of International Application No. PCT/CN2021/079089, filed Mar. 4, 2021. Each of the forgoing applications is herein incorporated by reference in its entirety for all purposes.

TECHNICAL FIELD

The present invention relates to the field of display technology, more particularly, to a light emitting substrate, a display apparatus, and a method of driving a light emitting substrate.

BACKGROUND

A front-lit reflective display apparatus is a display apparatus illuminated by a front light. Typically, the front-lit reflective display apparatus is a liquid crystal display apparatus, which would otherwise by viewed in ambient light. Having a front light improves the display performance.

SUMMARY

In one aspect, the present disclosure provides a light emitting substrate, comprising a plurality of light emitting controlling units arranged in M rows and N columns, M is an integer equal to or greater than one, N is an integer equal to or greater than one, wherein a respective one of the plurality of light emitting controlling units comprises a plurality of light emitting elements arranged in J rows and I columns, J being an integer equal to or greater than one, I being an integer equal to or greater than one, a i-th column of the I columns of light emitting elements comprises J rows of light emitting elements, $1 \leq i \leq I$; (M×J) number of first voltage signal lines; and (M×J) number of groups of second voltage signal lines; wherein first terminals of light emitting elements in a respective row of light emitting elements are electrically connected to a respective first voltage signal line of the (M×J) number of first voltage signal lines; second terminals of light emitting elements in the respective row of light emitting elements are respectively connected to I number of second voltage signal lines in a respective group of second voltage signal lines of the (M×J) number of groups of second voltage signal lines.

Optionally, the respective one of the plurality of light emitting controlling units comprises Q number of groups of light emitting elements, Q being an integer equal to or greater than one; a respective group of the Q number of groups of light emitting elements comprises K columns of light emitting elements, K being an integer equal to or greater than one; a k-th column of the K columns of light emitting elements comprises J rows of light emitting elements, $1 \leq k \leq K$, and $I = K*Q$; the respective group of second voltage signal lines comprises Q number of sub-groups of second voltage signal lines, a respective sub-group of the Q number of sub-groups of second voltage signal lines comprising K number of second voltage signal lines; and in the respective row of light emitting elements, second terminals of light emitting elements in k-th columns respectively in q-th groups of the Q number of groups of light emitting elements respectively from N number of light emitting controlling units in a same row are electrically connected to a k-th second voltage signal line of the K number of second voltage signal lines in a q-th sub-group of the Q number of sub-groups of second voltage signal lines in the respective group of second voltage signal lines, $1 \leq q \leq Q$.

Optionally, the (M×J) number of groups of second voltage signal lines comprise M number of stages of second voltage signal lines; a respective stage of the M number of stages of second voltage signal lines comprises J number of groups of second voltage signal lines; a respective group of the J number of groups of second voltage signal lines comprises Q number of sub-groups of second voltage signal lines; a respective sub-group of the Q number of sub-groups of second voltage signal lines comprises K number of second voltage signal lines; and second terminals of light emitting elements in k-th columns respectively in q-th groups of the Q number of groups of light emitting elements respectively from N number of light emitting controlling units in a m-th row of the plurality of light emitting controlling units are respectively electrically connected to a k-th second voltage signal line of the K number of second voltage signal lines in a q-th sub-group of the Q number of sub-groups of second voltage signal lines in a j-th group of the J number of groups of second voltage signal lines in a m-th stage of the M number of stages of second voltage signal lines.

Optionally, the light emitting substrate further comprises I*J number of second voltage signal supply lines; and the I number of second voltage signal lines in the respective group of second voltage signal lines are respectively connected to a set of I number of second voltage signal supply lines.

Optionally, the I*J number of second voltage signal supply lines are grouped into Q number of groups of second voltage signal supply lines, Q being an integer equal to or greater than one; a respective group of the Q number of groups of second voltage signal supply lines comprises K number of sub-groups of second voltage signal supply lines, K being an integer equal to or greater than one; and a respective sub-group of the K number of sub-groups of second voltage signal supply lines comprises J number of second voltage signal supply lines.

Optionally, the (M×J) number of groups of second voltage signal lines comprises M number of stages of second voltage signal lines; a respective stage of the M number of stages of second voltage signal lines comprises J number of groups of second voltage signal lines; a respective group of the J number of groups of second voltage signal lines comprises Q number of sub-groups of second voltage signal lines; a respective sub-group of the Q number of sub-groups of second voltage signal lines comprises K number of second voltage signal lines; and k-th second voltage signal lines respectively of the K number of second voltage signal lines in q-th sub-groups respectively of the Q number of sub-groups of second voltage signal lines in j-th groups respectively of the J number of groups of second voltage signal lines in the M number of stages of second voltage signal lines are respectively electrically connected to a j-th second voltage signal supply line of the J number of second voltage signal supply lines in a k-th sub-group of the K number of sub-groups of second voltage signal supply lines in a q-th group of the Q number of groups of second voltage signal supply lines.

Optionally, the respective one of the plurality of light emitting controlling units comprises Q number of groups of light emitting elements, Q being an integer equal to or greater than one; a respective group of the Q number of groups of light emitting elements comprises K columns of light emitting elements, K being an integer equal to or greater than one; a k-th column of the K columns of light emitting elements comprises J rows of light emitting elements, $1 \leq k \leq K$, and $I=K*Q$; respectively through the k-th second voltage signal lines respectively of the K number of second voltage signal lines in the q-th sub-groups respectively of the Q number of sub-groups of second voltage signal lines in the j-th groups respectively of the J number of groups of second voltage signal lines in the M number of stages of second voltage signal lines, the j-th second voltage signal supply line of the J number of second voltage signal supply lines in a k-th sub-group of the K number of sub-groups of second voltage signal supply lines in a q-th group of the Q number of groups of second voltage signal supply lines is electrically connected to second terminals of light emitting elements in k-th columns respectively in q-th groups of the Q number of groups of light emitting elements respectively from the plurality of light emitting controlling units in M rows and N columns.

Optionally, the J rows of light emitting elements in the k-th column of the K columns of light emitting elements comprise light emitting elements of a k-th color of K number of different colors; light emitting elements in (UK) number of columns out of the I columns of light emitting elements are of the k-th color; and light emitting elements in a same column of the I columns of light emitting elements are of a same color.

Optionally, color patterns in the Q number of groups of light emitting elements are the same.

Optionally, K=3.

Optionally, color patterns in the plurality of light emitting controlling units are the same.

Optionally, the plurality of light emitting elements are mini light emitting diodes or micro light emitting diodes.

Optionally, the light emitting substrate comprises a base substrate; a first metal layer and a second metal layer on the base substrate; and at least one insulating layer spacing apart the first metal layer from the second metal layer.

Optionally, the light emitting substrate further comprises a plurality of signal lines; wherein the plurality of signal lines comprise multiple signal lines extending along a first direction and multiple signal lines extending along a second direction, the second direction being different from the first direction; the multiple signal lines extending along the first direction are parts of one of the first metal layer and the second metal layer; and the multiple signal lines extending along the second direction are parts of another of the first metal layer and the second metal layer.

Optionally, the multiple signal lines extending along the first direction comprise second voltage signal lines; and the multiple signal lines extending along the second direction comprise first voltage signal lines.

Optionally, the at least one insulating layer comprises a resin layer.

Optionally, the at least one insulating layer further comprises a first passivation layer between the resin layer and the first metal layer, and a second passivation layer between the resin layer and the second metal layer.

Optionally, the light emitting substrate further comprises a third passivation layer on a side of the second metal layer away from the base substrate; and at least two vias extending through the third passivation layer and partially exposing a surface of the second metal layer.

Optionally, each of the first metal layer and the second metal layer comprises copper; and the second metal layer further comprises nickel gold on the surface partially exposed by the at least two vias.

Optionally, each of the first metal layer and the second metal layer comprises copper; and the second metal layer further comprises indium tin oxide on the surface partially exposed by the at least two vias.

Optionally, the resin layer is limited in a micro light emitting diode bonding region.

Optionally, the light emitting substrate further comprises at least one gas releasing via.

Optionally, the at least one gas releasing via extending through the second passivation layer and the third passivation layer.

Optionally, the light emitting substrate comprises a plurality of gas releasing vias arranged in an array.

Optionally, the light emitting substrate further comprises a first set of bonding pads and a second set of bonding pads; wherein the first set of bonding pads comprises a first bonding pad and a second bonding pad; and the second set of bonding pads comprises a third bonding pad and a fourth bonding pad.

In another aspect, the present disclosure provides a display apparatus, comprising the light emitting substrate described herein or fabricated by a method described herein, a reflective-type display panel, and an integrated circuit connected to the reflective-type display panel; wherein the light emitting substrate is on a display side of the reflective-type display panel.

Optionally, the reflective-type display panel comprises a plurality of first signal lines and a plurality of second signal lines; the light emitting substrate comprises a plurality of signal lines; the plurality of signal lines comprise multiple signal lines extending along a first direction and multiple signal lines extending along a second direction, the second direction being different from the first direction; the multiple signal lines extending along the first direction cross over the plurality of first signal lines at an angle greater than zero and less than 20 degrees, and/or the multiple signal lines extending along the second direction cross over the plurality of second signal lines at an angle greater than zero and less than 20 degrees; and the plurality of first signal lines are a plurality of data lines and the plurality of second signal lines are a plurality of gate lines.

In another aspect, the present disclosure provides a method of driving a light emitting substrate comprising a plurality of light emitting controlling units arranged in M rows and N columns, M is an integer equal to or greater than one, N is an integer equal to or greater than one, wherein a respective one of the plurality of light emitting controlling units comprises a plurality of light emitting elements arranged in J rows and I columns, J being an integer equal to or greater than one, I being an integer equal to or greater than one, a i-th column of the I columns of light emitting elements comprises J rows of light emitting elements, $1 \leq i \leq I$; the method comprises electrically connecting first terminals of light emitting elements in a respective row of light emitting elements to a respective first voltage signal line of (M×J) number of first voltage signal lines; electrically connecting second terminals of light emitting elements in the respective row of light emitting elements to I number of second voltage signal lines in a respective group of second voltage signal lines of (M×J) number of groups of second voltage signal lines; providing a first voltage signal to the first terminals; and providing a second voltage signal to a respective one of the second terminals.

Optionally, the respective one of the plurality of light emitting controlling units comprises Q number of groups of light emitting elements, a respective group of the Q number of groups of light emitting elements comprises K columns of light emitting elements, the respective group of second voltage signal lines comprises Q number of sub-groups of second voltage signal lines, a respective sub-group of the Q number of sub-groups of second voltage signal lines comprising K number of second voltage signal lines, Q being an integer equal to or greater than one, K being an integer equal to or greater than one; the method further comprises forming J rows of light emitting elements in a k-th column of the K columns of light emitting elements, 1≤k≤K, and I=K*Q; in the respective row of light emitting elements, electrically connecting second terminals of light emitting elements in k-th columns respectively in q-th groups of the Q number of groups of light emitting elements respectively from N number of light emitting controlling units in a same row to a k-th second voltage signal line of the K number of second voltage signal lines in a q-th sub-group of the Q number of sub-groups of second voltage signal lines in the respective group of second voltage signal lines, 1≤q≤Q; and time-sequentially providing second voltage signals to the K number of second voltage signal lines.

Optionally, the (M×J) number of groups of second voltage signal lines comprises M number of stages of second voltage signal lines, a respective stage of the M number of stages of second voltage signal lines comprises J number of groups of second voltage signal lines, a respective group of the J number of groups of second voltage signal lines comprises Q number of sub-groups of second voltage signal lines, a respective sub-group of the Q number of sub-groups of second voltage signal lines comprises K number of second voltage signal lines; and the method further comprises respectively electrically connecting second terminals of light emitting elements in k-th columns respectively in q-th groups of the Q number of groups of light emitting elements respectively from N number of light emitting controlling units in a m-th row of the plurality of light emitting controlling units to a k-th second voltage signal line of the K number of second voltage signal lines in a q-th sub-group of the Q number of sub-groups of second voltage signal lines in a j-th group of the J number of groups of second voltage signal lines in a m-th stage of the M number of stages of second voltage signal lines; and time-sequentially providing second voltage signals to the K number of second voltage signal lines in the q-th sub-group of the Q number of sub-groups of second voltage signal lines in the j-th group of the J number of groups of second voltage signal lines in the m-th stage of the M number of stages of second voltage signal lines.

Optionally, the method further comprises respectively connecting the I number of second voltage signal lines in the respective group of second voltage signal lines to I number of second voltage signal supply lines out of I*J number of second voltage signal supply lines; and providing second voltage signals respectively from the I number of second voltage signal supply lines to the I number of second voltage signal lines in the respective group of second voltage signal lines.

Optionally, the I*J number of second voltage signal supply lines are grouped into Q number of groups of second voltage signal supply lines, Q being an integer equal to or greater than one, a respective group of the Q number of groups of second voltage signal supply lines comprises K number of sub-groups of second voltage signal supply lines, K being an integer equal to or greater than one, a respective sub-group of the K number of sub-groups of second voltage signal supply lines comprises J number of second voltage signal supply lines; the method further comprises time-sequentially providing second voltage signals to the K number of sub-groups of second voltage signal supply lines one sub-group by one-group.

In another aspect, the present disclosure provides a method of fabricating a light emitting substrate, comprising forming a plurality of light emitting controlling units arranged in M rows and N columns, M is an integer equal to or greater than one, N is an integer equal to or greater than one, wherein a respective one of the plurality of light emitting controlling units comprises a plurality of light emitting elements arranged in J rows and I columns, J being an integer equal to or greater than one, I being an integer equal to or greater than one, a i-th column of the I columns of light emitting elements comprises J rows of light emitting elements, 1≤i≤I; forming (M×J) number of first voltage signal lines; and forming (M×J) number of groups of second voltage signal lines; wherein forming the plurality of light emitting controlling units comprises transferring micro light emitting diodes onto a back panel in which the (M×J) number of first voltage signal lines and the (M×J) number of groups of second voltage signal lines are formed; electrically connecting first terminals of micro light emitting diodes in a respective row of light emitting elements to a respective first voltage signal line of the (M×J) number of first voltage signal lines; and electrically connecting second terminals of micro light emitting diodes in the respective row of light emitting elements to I number of second voltage signal lines in a respective group of second voltage signal lines of the (M×J) number of groups of second voltage signal lines.

Optionally, prior to transferring the micro light emitting diodes onto the back panel, the method further comprises at least one of measuring a resistance between two opposite terminals of a respective first voltage signal line; measuring a resistance between two opposite terminals of a respective second voltage signal line; or measuring a resistance between a respective terminal of the respective first voltage signal line and a respective terminal of the respective second voltage signal line.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a light emitting substrate, a display apparatus, and a method of driving a light emitting substrate that substantially obviate one or more of the problems due to limitations and disadvantages of the related art. In one aspect, the present disclosure provides a light emitting substrate. In some embodiments, the light emitting substrate includes a plurality of light emitting controlling units arranged in M rows and N columns, M is an integer equal to or greater than one, N is an integer equal to or greater than one, wherein a respective one of the plurality of light emitting controlling units comprises a plurality of light emitting elements arranged in J rows and I columns, J being an integer equal to or greater than one, I being an integer equal to or greater than one, a i-th column of the I columns of light emitting elements comprises J rows of light emitting elements, $1 \le i \le I$; (M×J) number of first voltage signal lines; and (M×J) number of groups of second voltage signal lines. Optionally, first terminals of light emitting elements in a respective row of light emitting elements are electrically connected to a respective first voltage signal line of the (M×J) number of first voltage signal lines. Optionally, second terminals of light emitting elements in the respective row of light emitting elements are respectively connected to I number of second voltage signal lines in a respective group of second voltage signal lines of the (M×J) number of groups of second voltage signal lines.

Figure 1:
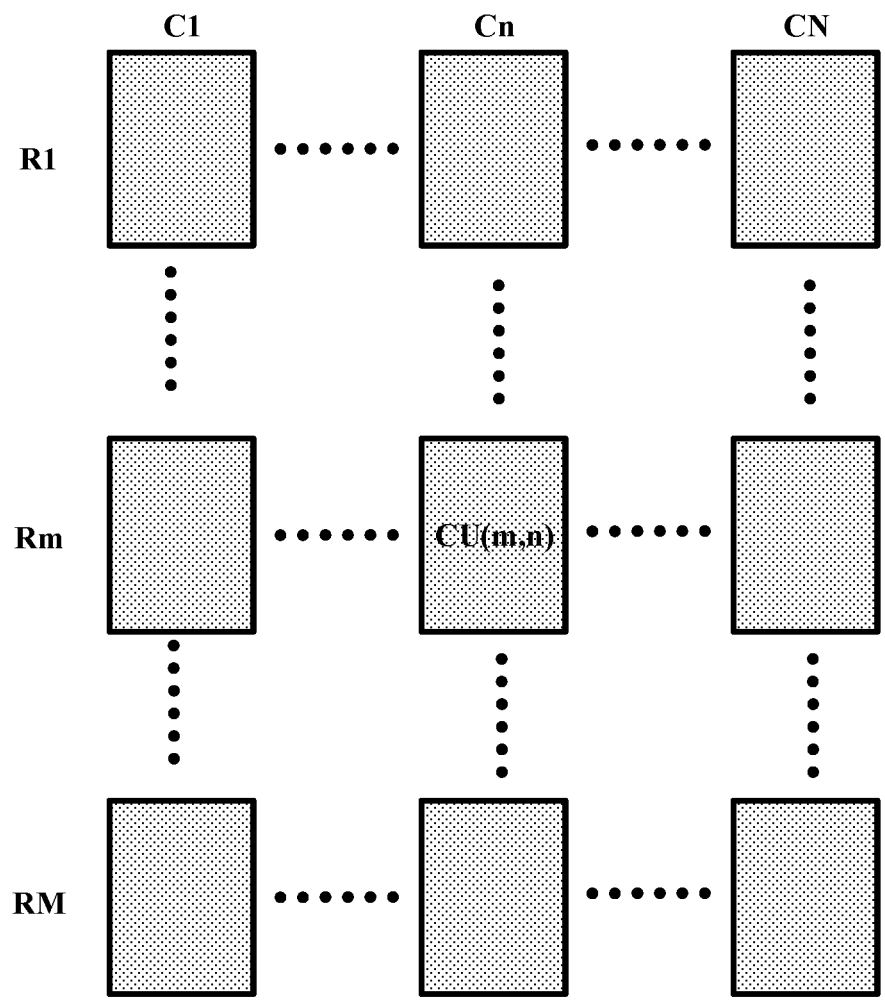
FIG. 1 is a schematic diagram illustrating the structure of a light emitting substrate in some embodiments according to the present disclosure.

FIG. 1 is a schematic diagram illustrating the structure of a light emitting substrate in some embodiments according to the present disclosure. Referring to FIG. 1, the light emitting substrate in some embodiments includes a plurality of light emitting controlling units CU(m, n) arranged in M rows and N columns. M is an integer equal to or greater than one, e.g., 1, 2, greater than 5, greater than 10, greater than 50, greater than 100. N is an integer equal to or greater than one, e.g., 1, 2, greater than 5, greater than 10, greater than 50, greater than 100. Optionally, $1 \le m \le M$, $1 \le n \le N$. As used herein, a row of light emitting controlling units is along a row direction, a column of light emitting controlling units is along a column direction, the row direction and the column direction are two non-parallel directions, e.g., the row direction and the column direction cross over each other. Optionally, the row direction and the column direction are perpendicular to each other. Optionally, the row direction and the column direction cross over each other at an inclined angle that is not 90 degrees.

In some embodiments, a total number of light emitting controlling unit in the light emitting substrate is one. In some embodiments, a total number of light emitting controlling units in the light emitting substrate is greater than one.

Figure 2:
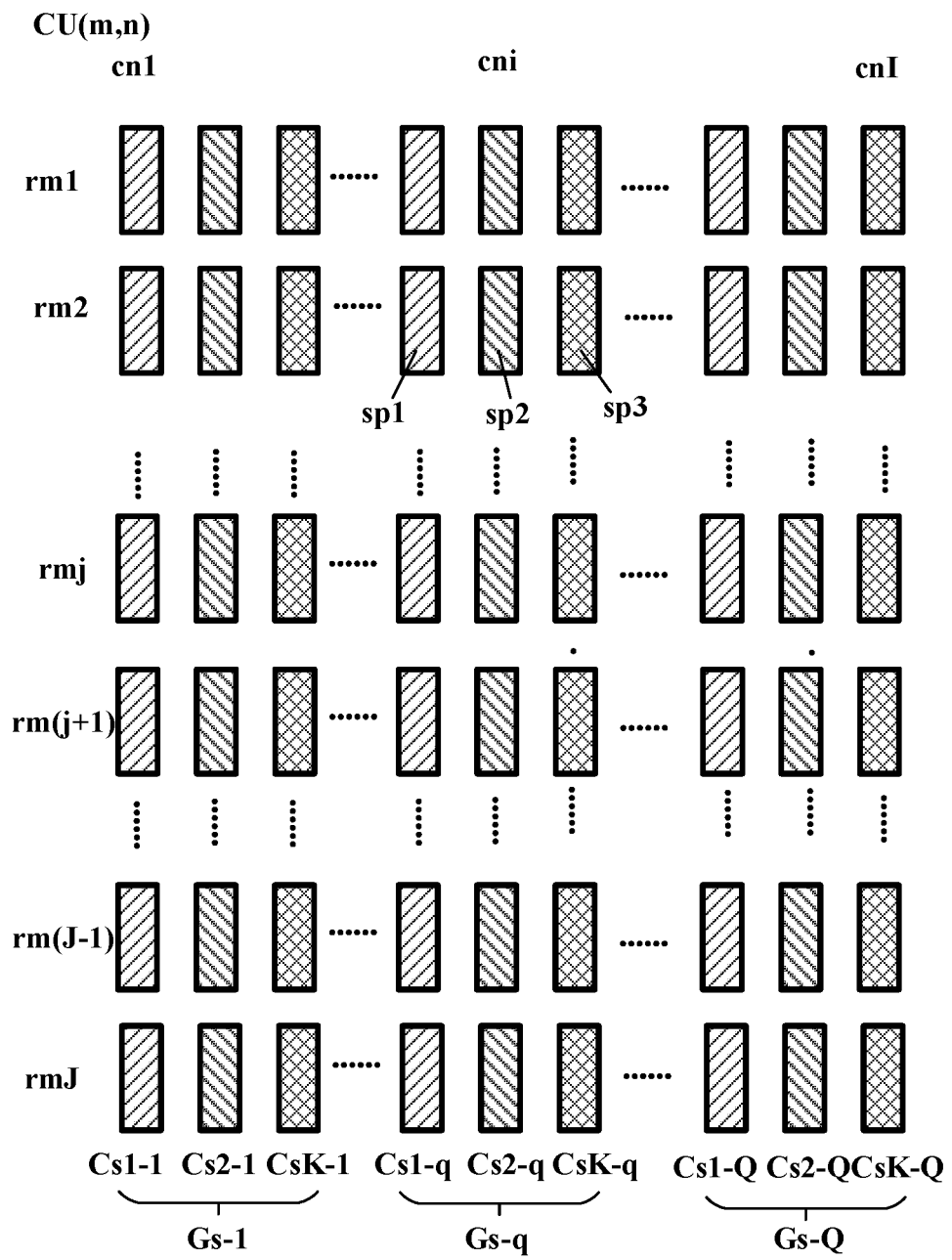
FIG. 2 is a schematic diagram illustrating the structure of a light emitting controlling unit in a light emitting substrate in some embodiments according to the present disclosure.

FIG. 2 is a schematic diagram illustrating the structure of a light emitting controlling unit in a light emitting substrate in some embodiments according to the present disclosure. Referring to FIG. 2, a respective one of the plurality of light emitting controlling units CU(m,n) is depicted. In some embodiments, the respective one of the plurality of light emitting controlling units CU(m,n) includes a plurality of light emitting elements arranged in J rows and I columns. J is an integer equal to or greater than one, e.g., 1, 2, greater than 5, greater than 10, greater than 50, greater than 100. I is an integer equal to or greater than one, e.g., 1, 2, greater than 5, greater than 10, greater than 50, greater than 100. In some embodiments, the light emitting elements are, for example, mini light emitting diodes (mini LED) or micro light emitting diodes (micro LED). Mini LED or micro LED-based display have the advantages of high brightness, high contrast ratio, fast response, and low power consumption.

In some embodiments, a i-th column cni of the I columns of light emitting elements includes J rows of light emitting elements, $1 \le i \le I$. For example, the i-th column cni includes light emitting elements in rm1, rm2, . . . , rmj, rm(j+1), . . . , rm(J−1), and rmJ. As shown in FIG. 2, in one example, the plurality of light emitting elements includes light emitting elements of different colors, e.g., a respective light emitting element of a first color sp1, a respective light emitting element of a second color sp2, and a respective light emitting element of a third color sp3. In another example, light emitting elements in a respective column of the respective one of the plurality of light emitting controlling units CU(m,n) are of a same color. For example, light emitting elements in column cn1 are all light emitting elements of the first color, light emitting elements in column cni are all light emitting elements of the second color, and light emitting elements in column cnI are all light emitting elements of the third color. In another example, a respective row of the respective one of the plurality of light emitting controlling units CU(m,n) includes light emitting elements arranged in repeating color patterns. For example, light emitting elements in row rmj includes a repeating pattern of the respective light emitting element of a first color sp1, the respective light emitting element of a second color sp2, and the respective light emitting element of a third color sp3.

Figure 3:
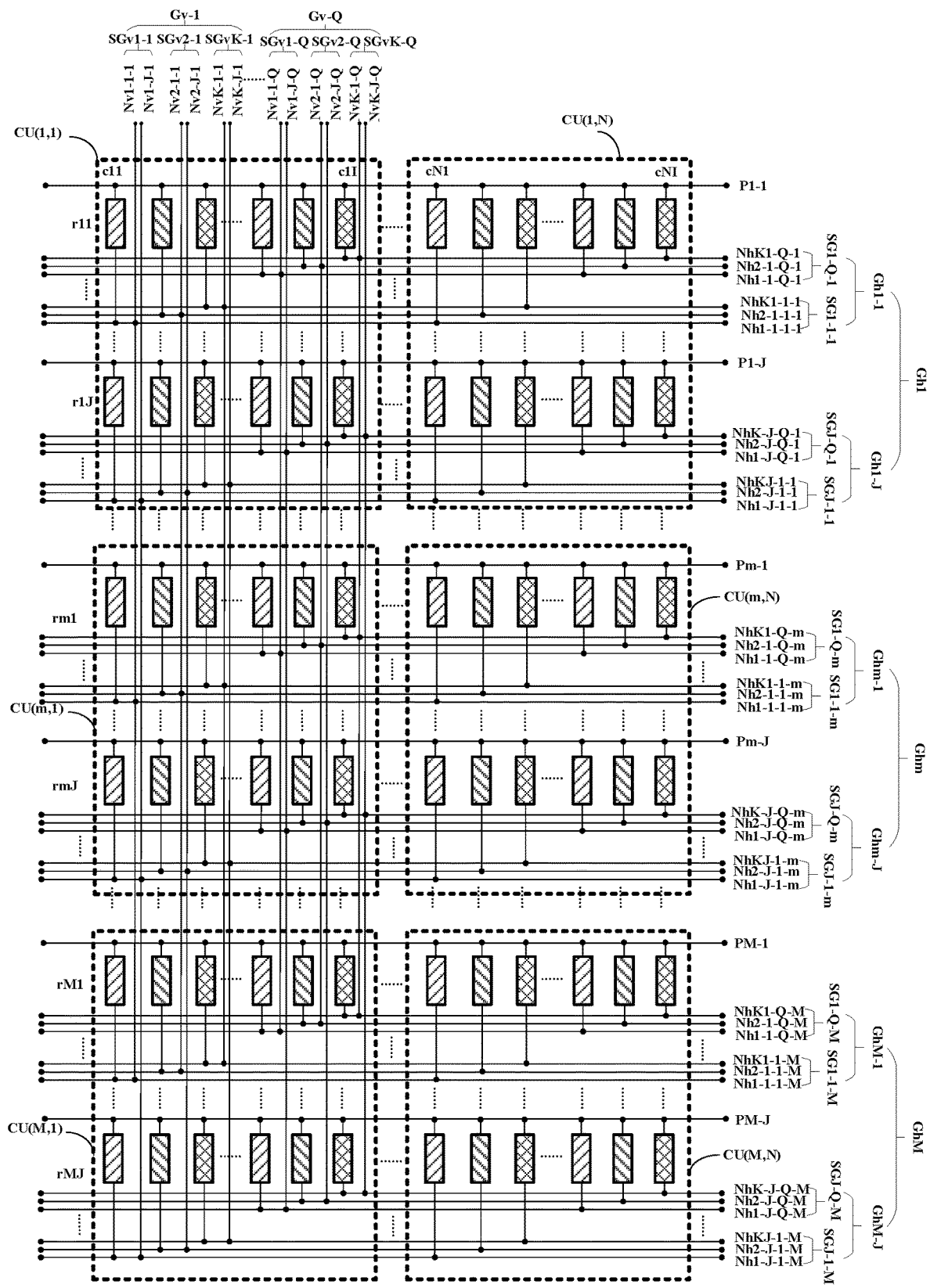
FIG. 3 is a schematic diagram illustrating the structure of a light emitting substrate in some embodiments according to the present disclosure.
Figure 4:
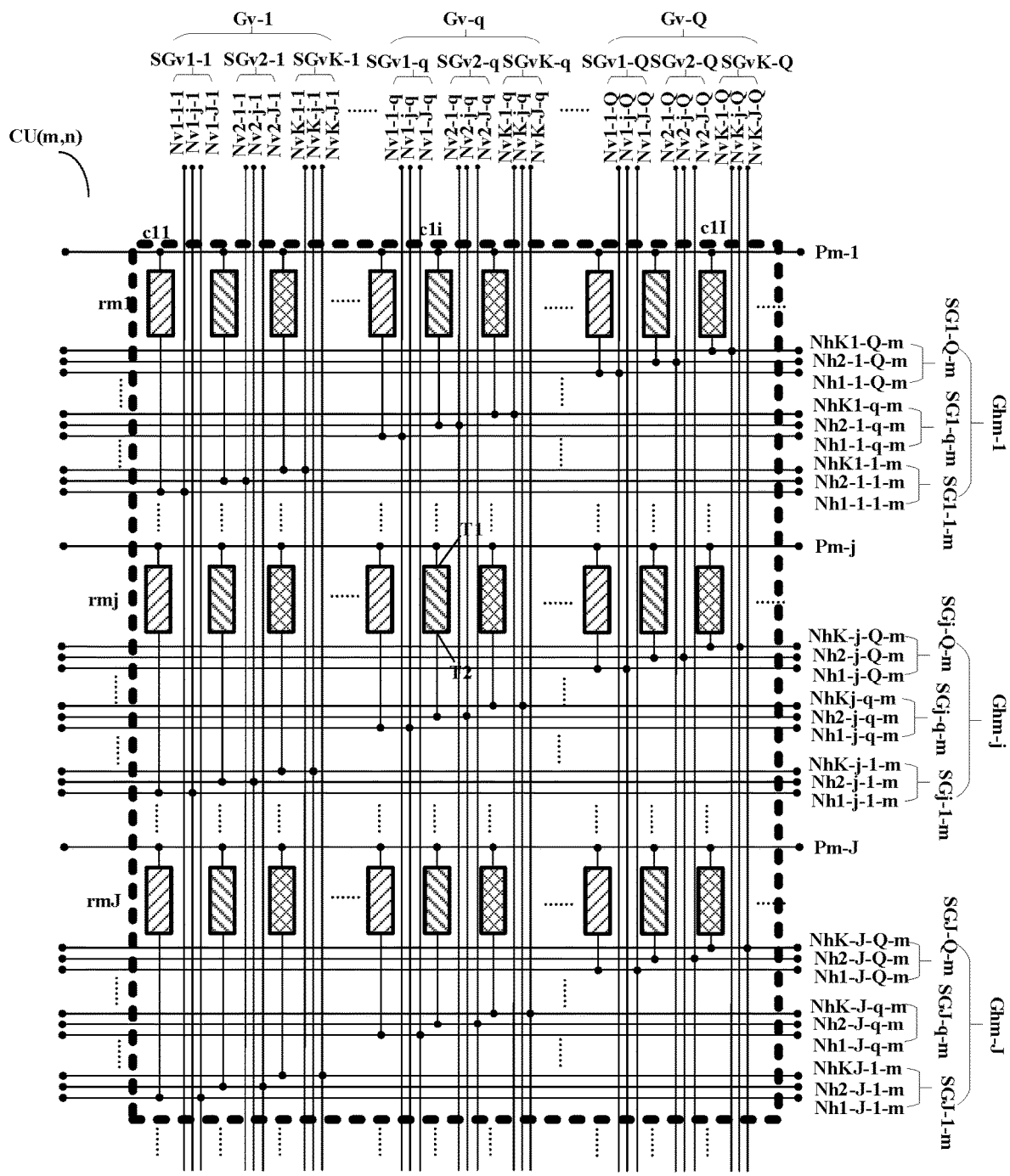
FIG. 4 is a schematic diagram illustrating the structure of a light emitting controlling unit in a light emitting substrate in some embodiments according to the present disclosure.

FIG. 3 is a schematic diagram illustrating the structure of a light emitting substrate in some embodiments according to the present disclosure. FIG. 4 is a schematic diagram illustrating the structure of a light emitting controlling unit in a light emitting substrate in some embodiments according to the present disclosure. In FIG. 3, light emitting controlling units in the first column of the N columns (e.g., CU(1,1), . . . , CU(m,1), . . . , CU(M,1)) and light emitting controlling units in a N-th column of the N columns (e.g., CU(1,N), ..., CU(m,N), ..., CU(M,N)) are depicted. In FIG. 4, a respective one of the plurality of light emitting controlling units CU(m,n) is depicted. In one example, the light emitting controlling unit CU(m,n) depicted in FIG. 4 is a light emitting controlling unit in the first row and in the first column, e.g., CU(1,1).

Referring to FIG. 3 and FIG. 4, the light emitting substrate in some embodiments further includes (M×J) number of first voltage signal lines, including (P1-1, ..., P1-J), ..., (Pm-1, ... PmJ), ..., (PM-1, ..., PM-J). The (M×J) number of first voltage signal lines are configured to provide first voltage signals (e.g., positive voltage signals) to, for example, anodes of light emitting diodes in the light emitting substrate. As shown in FIG. 3 and FIG. 4, first terminals of light emitting elements in a respective row of light emitting elements are electrically connected to a respective first voltage signal line of the (M×J) number of first voltage signal lines. For example, as shown in FIG. 3, first terminals of light emitting elements in r11 are electrically connected to P1-1, and first terminals of light emitting elements in r1J are electrically connected to P1-J. Each first voltage signal line corresponds to a respective row of light emitting elements. For example, in FIG. 4, J number of rows of light emitting elements (rm1, ..., rmj, ..., rmJ) are shown, J number of first voltage signal lines are shown (Pm-1, ..., Pm-j, ..., Pm-J), the J number of rows of light emitting elements and the J number of first voltage signal lines have a one-to-one correspondence relationship. Optionally, in FIG. 4, m=1, and n=1. First terminals T1 of light emitting elements in rm1 are electrically connected to Pm-1, first terminals T1 of light emitting elements in rmj are electrically connected to Pm-j, and first terminals T1 of light emitting elements in rmJ are electrically connected to Pm-J.

In some embodiments, the light emitting substrate further includes (M×J) number of groups of second voltage signal lines, including (Gh1-1, ..., Gh1-J), ..., (Ghm-1, ... GhmJ), ..., (GhM-1, ..., GhM-J). Optionally, second terminals T2 of light emitting elements in the respective row of light emitting elements are respectively connected to I number of second voltage signal lines in a respective group of second voltage signal lines of the (M×J) number of groups of second voltage signal lines. For example, as shown in FIG. 3, second terminals of light emitting elements in r1J are respectively connected to I number of second voltage signal lines (Nh1-J-1-1, Nh2-J-1-1, NhK-J-1-1, ..., Nh1-J-Q-1, Nh2-J-Q-1, NhK-J-Q-1) in Gh1-J group of the (M×J) number of groups of second voltage signal lines. Second terminals of light emitting elements in r11 are respectively connected to I number of second voltage signal lines (Nh1-1-1-1, Nh2-1-1-1, NhK-1-1-1, ..., Nh1-1-Q-1, Nh2-1-Q-1, NhK-1-Q-1) in Gh1-1 group of the (M×J) number of groups of second voltage signal lines. Referring to FIG. 4, second terminals T2 of light emitting elements in rm1 are respectively connected to I number of second voltage signal lines (Nh1-1-1-*m*, Nh2-1-1-*m*, NhK-1-1-*m*, ..., Nh1-1-Q-m, Nh2-1-Q-m, NhK-1-Q-m, ..., Nh1-1-Q-m, Nh2-1-Q-m, NhK-1-Q-m) in Ghm-J group of the (M×J) number of groups of second voltage signal lines; second terminals T2 of light emitting elements in rmj are respectively connected to I number of second voltage signal lines (Nh1-*j*-1-*m*, Nh2-*j*-1-*m*, NhK-j-1-*m*, ..., Nh1-*j*-Q-m, Nh2-*j*-Q-m, NhK-j-Q-m, ..., Nh1-*j*-Q-m, Nh2-*j*-Q-m, NhK-j-Q-m) in Ghm-j group of the (M×J) number of groups of second voltage signal lines; and second terminals T2 of light emitting elements in rmJ are respectively connected to I number of second voltage signal lines (Nh1-J-1-*m*, Nh2-J-1-*m*, NhK-J-1-*m*, ..., Nh1-J-Q-m, Nh2-J-Q-m, NhK-J-Q-m) in Ghm-J group of the (M×J) number of groups of second voltage signal lines.

In some embodiments, and referring to FIG. 2, the respective one of the plurality of light emitting controlling units includes Q number of groups of light emitting elements. Q is an integer equal to or greater than one, e.g., 1, 2, greater than 5, greater than 10, greater than 50, greater than 100. For example, the respective one of the plurality of light emitting controlling units CU(m,n) includes Q number of groups of light emitting elements Gs-1, ..., Gs-q, ..., Gs-Q. A respective group of the Q number of groups of light emitting elements includes K columns of light emitting elements. For example, Gs-1 includes Cs1-1, Cs2-1, CsK-1, Gs-q includes Cs1-*q*, Cs2-*q*, CsK-q, and Gs-Q includes Cs1-Q, Cs2-Q, CsK-Q. K is an integer equal to or greater than one, e.g., 1, 2, 3, 4, 5, 6, 7, 8, 9, 10, or more. Optionally, K=3 (as depicted in FIG. 2). In some embodiments, a k-th column of the K columns of light emitting elements includes J rows of light emitting elements (e.g., rm1, rm2, ..., rmj, rm(j+1), ..., rm(J−1), rmJ). Optionally, 1≤k≤K. Optionally, I=K*Q.

In some embodiments, the respective group of second voltage signal lines includes Q number of sub-groups of second voltage signal lines. For example, referring to FIG. 3, Gh1-1 includes Q number of sub-groups SG1-1-1 to SG1-Q-1; Gh1-J includes Q number of sub-groups SGJ-1-1 to SGJ-Q-1; Ghm-1 includes Q number of sub-groups SG1-1-*m* to SG1-Q-m; Ghm-J includes Q number of sub-groups SGJ-1-*m* to SGJ-Q-m; GhM-1 includes Q number of sub-groups SG1-1-M to SG1-Q-M; GhM-J includes Q number of sub-groups SGJ-1-M to SGJ-Q-M. Referring to FIG. 4, Ghm-1 includes Q number of sub-groups SG1-1-*m*, ..., SG1-*q*-*m*, ..., SG1-Q-m; Ghm-j includes Q number of sub-groups SGj-1-*m*, ..., SGj-q-m, ..., SGj-Q-m; and Ghm-J includes Q number of sub-groups SGJ-1-*m*, ..., SGJ-q-m, ..., SGJ-Q-m.

In some embodiments, a respective sub-group of the Q number of sub-groups of second voltage signal lines includes K number of second voltage signal lines. For example, SG1-1-*m* includes Nh1-1-1-*m*, Nh2-1-1-*m*, NhK1-1-*m*; SG1-*q*-*m* includes Nh1-1-*q*-*m*, Nh2-1-*q*-*m*, NhK1-*q*-*m*; SG1-Q-m includes Nh1-1-Q-m, Nh2-1-Q-m, NhK-1-Q-m. In another example, SGj-1-*m* includes Nh1-*j*-1-*m*, Nh2-1-*j*-*m*, NhK1-*j*-*m*; SGj-q-m includes Nh1-*j*-*q*-*m*, Nh2-*j*-*q*-*m*, NhKj-q-m; SGj-Q-m includes Nh1-*j*-Q-m, Nh2-*j*-Q-m, NhKj-Q-m. In another example, SGJ-1-*m* includes Nh1-J-1-*m*, Nh2-1-J-m, NhK1-J-m; SGj-q-m includes Nh1-J-q-m, Nh2-J-q-m, NhKJ-q-m; SGJ-Q-m includes Nh1-J-Q-m, Nh2-J-Q-m, NhK-J-Q-m.

In some embodiments, in the respective row of light emitting elements, second terminals of light emitting elements in k-th columns respectively in q-th groups of the Q number of groups of light emitting elements respectively from N number of light emitting controlling units in a same row are electrically connected to a k-th second voltage signal line of the K number of second voltage signal lines in a q-th sub-group of the Q number of sub-groups of second voltage signal lines in the respective group of second voltage signal lines, 1≤q≤Q. Referring FIG. 4, in one example, second terminals of light emitting elements in first columns respectively in first groups of the Q number of groups of light emitting elements respectively from N number of light emitting controlling units (CU(1,1) to CU(1,N)) in r11 are respectively electrically connected to a 1st second voltage signal line Nh1-1-1-1 of the K number of second voltage signal lines (including Nh1-1-1-1, Nh2-1-1-1, NhK-1-1-1) in a first sub-group SG1-1-1 of the Q number of sub-groups (including SG1-1-1 to SG1-Q-1) of second voltage signal lines in Gh1-1. In another example, second terminals of light emitting elements in K-th columns respectively in Q-th groups of the Q number of groups of light emitting elements respectively from N number of light emitting controlling units (CU(1,1) to CU(1,N)) in r11 are respectively electrically connected to a K-th second voltage signal line NhK-1-Q-1 of the K number of second voltage signal lines (including Nh1-1-Q-1, Nh2-1-Q-1, NhK-1-Q-1) in a Q-th sub-group SG1-Q-1 of the Q number of sub-groups (including SG1-1-1 to SG1-Q-1) of second voltage signal lines in Gh1-1. In another example, second terminals of light emitting elements in first columns respectively in first groups of the Q number of groups of light emitting elements respectively from N number of light emitting controlling units (CU(m,1) to CU(m,N)) in rm1 are respectively electrically connected to a 1st second voltage signal line Nh1-1-1-*m* of the K number of second voltage signal lines (including Nh1-1-1-*m*, Nh2-1-1-*m*, NhK-1-1-*m*) in a first sub-group SG1-1-*m* of the Q number of sub-groups (including SG1-1-*m* to SG1-Q-m) of second voltage signal lines in Ghm-1. In another example, second terminals of light emitting elements in K-th columns respectively in Q-th groups of the Q number of groups of light emitting elements respectively from N number of light emitting controlling units (CU(1,1) to CU(1,N)) in rm1 are respectively electrically connected to a K-th second voltage signal line NhK-1-Q-m of the K number of second voltage signal lines (including Nh1-1-Q-m, Nh2-1-Q-m, NhK-1-Q-m) in a Q-th sub-group SG1-Q-m of the Q number of sub-groups (including SG1-1-*m* to SG1-Q-m) of second voltage signal lines in Ghm-1.

Referring to FIG. 3, in some embodiments, the (M×J) number of groups of second voltage signal lines include M number of stages of second voltage signal lines Gh1, . . . , Ghm, . . . , GhM. A respective stage of the M number of stages corresponds to a respective row of light emitting controlling units of the plurality of light emitting units. For example, Gh1 is configured to provide second voltage signals to a first row of the light emitting controlling units CU(1,1), . . . , CU(1,N); Ghm is configured to provide second voltage signals to a m-th row of the light emitting controlling units CU(m,1), . . . , CU(m,N); and GhM is configured to provide second voltage signals to a M-th row of the light emitting controlling units CU(M,1), . . . , CU(M,N).

In some embodiments, a respective stage of the M number of stages of second voltage signal lines includes J number of groups of second voltage signal lines. For example, Gh1 includes J number of groups of second voltage signal lines: Gh1-1 to Gh1-J; Ghm includes J number of groups of second voltage signal lines: Ghm-1 to Ghm-J; and GhM includes J number of groups of second voltage signal lines: GhM-1 to GhM-J.

In some embodiments, a respective group of the J number of groups of second voltage signal lines comprises Q number of sub-groups of second voltage signal lines. For example, Ghm-1 includes Q number of sub-groups of second voltage signal lines: SG1-1-*m* to SG1-Q-m; Ghm-J includes Q number of sub-groups of second voltage signal lines: SGJ-1-*m* to SGJ-Q-m. Referring to FIG. 4, Ghm-j includes Q number of sub-groups of second voltage signal lines: SGj-1-*m*, . . . , SGj-q-m, . . . , SGJ-Q-m.

In some embodiments, a respective sub-group of the Q number of sub-groups of second voltage signal lines comprises K number of second voltage signal lines. For example, SG1-1-*m* includes Nh1-1-1-*m*, Nh2-1-1-*m*, NhK1-1-*m*; SG1-*q-m* includes Nh1-1-*q-m*, Nh2-1-*q-m*, NhK1-*q-m*; SG1-Q-m includes Nh1-1-Q-m, Nh2-1-Q-m, NhK-1-Q-m.

In another example, SGj-1-*m* includes Nh1-*j*-1-*m*, Nh2-1-*j-m*, NhK1-*j-m*; SGj-q-m includes Nh1-*j-q-m*, Nh2-*j-q-m*, NhKj-q-m; SGj-Q-m includes Nh1-*j*-Q-m, Nh2-*j*-Q-m, NhK-j-Q-m. In another example, SGJ-1-*m* includes Nh1-J-1-*m*, Nh2-1-J-m, NhK1-J-m; SGJ-q-m includes Nh1-J-q-m, Nh2-J-q-m, NhKJ-q-m; SGJ-Q-m includes Nh1-J-Q-m, Nh2-J-Q-m, NhK-J-Q-m.

In some embodiments, second terminals of light emitting elements in k-th columns respectively in q-th groups of the Q number of groups of light emitting elements respectively from N number of light emitting controlling units in a m-th row of the plurality of light emitting controlling units are respectively electrically connected to a k-th second voltage signal line of the K number of second voltage signal lines in a q-th sub-group of the Q number of sub-groups of second voltage signal lines in a j-th group of the J number of groups of second voltage signal lines in a m-th stage of the M number of stages of second voltage signal lines. Referring FIG. 4, in one example, second terminals of light emitting elements in first columns respectively in first groups of the Q number of groups of light emitting elements respectively from N number of light emitting controlling units (CU(1,1) to CU(1,N)) in r11 are respectively electrically connected to a 1st second voltage signal line Nh1-1-1-1 of the K number of second voltage signal lines (including Nh1-1-1-1, Nh2-1-1-1, NhK-1-1-1) in a first sub-group SG1-1-1 of the Q number of sub-groups (including SG1-1-1 to SG1-Q-1) of second voltage signal lines in a first group Gh1-1 of the J number of groups (including Gh1-1 to Gh1-J) of second voltage signal lines in a first stage Gh1 of the M number of stages (including Gh1, . . . , Ghm, . . . , GhM) of second voltage signal lines. In another example, second terminals of light emitting elements in K-th columns respectively in Q-th groups of the Q number of groups of light emitting elements respectively from N number of light emitting controlling units (CU(1,1) to CU(1,N)) in r11 are respectively electrically connected to a K-th second voltage signal line NhK-1-Q-1 of the K number of second voltage signal lines (including Nh1-1-Q-1, Nh2-1-Q-1, NhK-1-Q-1) in a Q-th sub-group SG1-Q-1 of the Q number of sub-groups (including SG1-1-1 to SG1-Q-1) of second voltage signal lines in a first group Gh1-1 of the J number of groups (including Gh1-1 to Gh1-J) of second voltage signal lines in a first stage Gh1 of the M number of stages (including Gh1, . . . , Ghm, . . . , GhM) of second voltage signal lines. In another example, second terminals of light emitting elements in first columns respectively in first groups of the Q number of groups of light emitting elements respectively from N number of light emitting controlling units (CU(m,1) to CU(m,N)) in rm1 are respectively electrically connected to a 1st second voltage signal line Nh1-1-1-*m* of the K number of second voltage signal lines (including Nh1-1-1-*m*, Nh2-1-1-*m*, NhK-1-1-*m*) in a first sub-group SG1-1-*m* of the Q number of sub-groups (including SG1-1-*m* to SG1-Q-m) of second voltage signal lines in a first group Ghm-1 of the J number of groups (including Ghm-1 to Ghm-J) of second voltage signal lines in a m-th stage Ghm of the M number of stages (including Gh1, . . . , Ghm, . . . , GhM) of second voltage signal lines. In another example, second terminals of light emitting elements in K-th columns respectively in Q-th groups of the Q number of groups of light emitting elements respectively from N number of light emitting controlling units (CU(1,1) to CU(1,N)) in rm1 are respectively electrically connected to a K-th second voltage signal line NhK-1-Q-m of the K number of second voltage signal lines (including Nh1-1-Q-m, Nh2-1-Q-m, NhK-1-Q-m) in a Q-th sub-group SG1-Q-m of the Q number of sub-groups (including SG1-1-$m$ to SG1-Q-m) of second voltage signal lines in a first group Ghm-1 of the J number of groups (including Ghm-1 to Ghm-J) of second voltage signal lines in a m-th stage Ghm of the M number of stages (including Gh1, ..., Ghm, ..., GhM) of second voltage signal lines.

In some embodiments, the light emitting substrate further includes I*J number of second voltage signal supply lines, including (Nv1-1-1, ..., Nv1-$j$-1, ..., Nv1-J-1), (Nv2-1-1, ..., Nv2-$j$-1, ..., Nv2-J-1), (NvK-1-1, ..., NvK-j-1, ..., NvK-J-1), ..., (Nv1-1-$q$, ..., Nv1-$j$-$q$, ..., Nv1-J-q), (Nv2-1-$q$, ..., Nv2-$j$-$q$, ..., Nv2-J-q), (NvK-1-$q$, ..., NvK-j-q, ..., NvK-J-q) ..., (Nv1-1-Q, ..., Nv1-$j$-Q, ..., Nv1-J-Q), (Nv2-1-Q, ..., Nv2-$j$-Q, ..., Nv2-J-Q), (NvK-1-Q, ..., NvK-j-Q, ..., NvK-J-Q), as shown in FIG. 4. The I*J number of second voltage signal supply lines are configured to supply second voltage signals to the (M×J) number of groups of second voltage signal lines.

In some embodiments, the I number of second voltage signal lines in the respective group of second voltage signal lines are respectively connected to a set of I number of second voltage signal supply lines out of the I*J number of second voltage signal supply lines. In one example, the I number of second voltage signal lines in Ghm-1 are respectively connected to a 1st set of I number of second voltage signal supply lines out of the I*J number of second voltage signal supply lines. In another example, the I number of second voltage signal lines in Ghm-j are respectively connected to a j-th set of I number of second voltage signal supply lines out of the I*J number of second voltage signal supply lines. In another example, the I number of second voltage signal lines in Ghm-J are respectively connected to a J-th set of I number of second voltage signal supply lines out of the I*J number of second voltage signal supply lines.

In some embodiments, the I*J number of second voltage signal supply lines are grouped into Q number of groups of second voltage signal supply lines, including Gv-1, ..., Gv-q, ..., Gv-Q. Q is an integer equal to or greater than one, e.g., 1, 2, greater than 5, greater than 10, greater than 50, greater than 100. In some embodiments, a respective group of the Q number of groups of second voltage signal supply lines includes K number of sub-groups of second voltage signal supply lines. K is an integer equal to or greater than one, e.g., 1, 2, 3, 4, 5, 6, 7, 8, 9, 10, or more. Optionally, K=3 (as depicted in FIG. 4). For example, Gv-1 includes K number of sub-groups of second voltage signal supply lines, including SGv1-1, SGv2-1, SGvK-1; Gv-q includes K number of sub-groups of second voltage signal supply lines, including SGv1-$q$, SGv2-$q$, SGvK-q; and Gv-Q includes K number of sub-groups of second voltage signal supply lines, including SGv1-Q, SGv2-Q, SGvK-Q. In some embodiments, a respective sub-group of the K number of sub-groups of second voltage signal supply lines includes J number of second voltage signal supply lines. For example, SGv1-1 includes J number of second voltage signal supply lines, including Nv1-1-1, ..., Nv1-$j$-1, ..., Nv1-J-1; SGv2-1 includes J number of second voltage signal supply lines, including Nv2-1-1, ..., Nv2-$j$-1, ..., Nv2-J-1; and SGvK-1 includes J number of second voltage signal supply lines, including NvK-1-1, ..., NvK-j-1, ..., NvK-J-1. In another example, SGv1-$q$ includes J number of second voltage signal supply lines, including Nv1-1-$q$, ..., Nv1-$j$-$q$, ..., Nv1-J-q; SGv2-$q$ includes J number of second voltage signal supply lines, including Nv2-1-$q$, ..., Nv2-$j$-$q$, ..., Nv2-J-q; and SGvK-q includes J number of second voltage signal supply lines, including NvK-1-$q$, ..., NvK-j-q, ..., NvK-J-q. In another example, SGv1-Q includes J number of second voltage signal supply lines, including Nv1-1-Q, ..., Nv1-$j$-Q, ..., Nv1-J-Q; SGv2-Q includes J number of second voltage signal supply lines, including Nv2-1-Q, ..., Nv2-$j$-Q, ..., Nv2-J-Q; and SGvK-Q includes J number of second voltage signal supply lines, including NvK-1-Q, ..., NvK-j-Q, ..., NvK-J-Q.

In some embodiments, k-th second voltage signal lines respectively of the K number of second voltage signal lines in q-th sub-groups respectively of the Q number of sub-groups of second voltage signal lines in j-th groups respectively of the J number of groups of second voltage signal lines in the M number of stages of second voltage signal lines are respectively electrically connected to a j-th second voltage signal supply line of the J number of second voltage signal supply lines in a k-th sub-group of the K number of sub-groups of second voltage signal supply lines in a q-th group of the Q number of groups of second voltage signal supply lines. Referring FIG. 4, in one example, 1st second voltage signal lines (including Nh1-1-1-1, ..., Nh1-1-1-$m$, ..., Nh1-1-1-M) respectively of the K number of second voltage signal lines in first sub-groups (including SG1-1-1, ..., SG1-1-$m$, ..., SG1-1-M) respectively of the Q number of sub-groups of second voltage signal lines in first groups (including Gh1-1, ..., Ghm-1, ..., GhM-1) respectively of the J number of groups of second voltage signal lines in the M number of stages (including Gh1, ..., Ghm, ..., GhM) of second voltage signal lines are respectively electrically connected to a 1st second voltage signal supply line (Nv1-1-1) of the J number of second voltage signal supply lines in a first sub-group (SGv1-1) of the K number of sub-groups of second voltage signal supply lines in a first group (Gv-1) of the Q number of groups of second voltage signal supply lines. In another example, K-th second voltage signal lines (including NhK-J-Q-1, ..., NhK-J-Q-m, ..., NhK-J-Q-M) respectively of the K number of second voltage signal lines in Q-th sub-groups (including SGJ-Q-1, ..., SGJ-Q-m, ..., SGJ-Q-M) respectively of the Q number of sub-groups of second voltage signal lines in J-th groups (including Gh1-J, ..., Ghm-J, ..., GhM-J) respectively of the J number of groups of second voltage signal lines in the M number of stages (including Gh1, ..., Ghm, ..., GhM) of second voltage signal lines are respectively electrically connected to a J-th second voltage signal supply line (NvK-J-Q) of the J number of second voltage signal supply lines in a K-th sub-group (SGvK-Q) of the K number of sub-groups of second voltage signal supply lines in a Q-th group (Gv-Q) of the Q number of groups of second voltage signal supply lines. In another example, 2nd second voltage signal lines (including Nh2-J-1-1, Nh2-J-1-$m$, Nh2-J-1-M) respectively of the K number of second voltage signal lines in first sub-groups (including SGJ-1-1, ..., SGJ-1-$m$, ..., SGJ-1-M) respectively of the Q number of sub-groups of second voltage signal lines in J-th groups (including Gh1-J, ..., Ghm-J, ..., GhM-J) respectively of the J number of groups of second voltage signal lines in the M number of stages (including Gh1, ..., Ghm, ..., GhM) of second voltage signal lines are respectively electrically connected to a J-th second voltage signal supply line (Nv2-J-1) of the J number of second voltage signal supply lines in a second sub-group (SGv2-1) of the K number of sub-groups of second voltage signal supply lines in a first group (Gv-1) of the Q number of groups of second voltage signal supply lines.

In some embodiments, and referring to FIG. 2, the respective one of the plurality of light emitting controlling units includes Q number of groups of light emitting elements. Q is an integer equal to or greater than one, e.g., 1, 2, greater than 5, greater than 10, greater than 50, greater than 100. For example, the respective one of the plurality of light emitting controlling units CU(m,n) includes Q number of groups of light emitting elements Gs-1, . . . , Gs-q, . . . , Gs-Q. A respective group of the Q number of groups of light emitting elements includes K columns of light emitting elements. For example, Gs-1 includes Cs1-1, Cs2-1, CsK-1, Gs-q includes Cs1-$q$, Cs2-$q$, CsK-q, and Gs-Q includes Cs1-Q, Cs2-Q, CsK-Q. K is an integer equal to or greater than one, e.g., 1, 2, 3, 4, 5, 6, 7, 8, 9, 10, or more. Optionally, K=3 (as depicted in FIG. 2). In some embodiments, a k-th column of the K columns of light emitting elements includes J rows of light emitting elements (e.g., rm1, rm2, rmj, rm(j+1), rm(J−1), rmJ). Optionally, 1≤k≤K. Optionally, I=K*Q.

Referring to FIG. 3, in some embodiments, respectively through the k-th second voltage signal lines respectively of the K number of second voltage signal lines in the q-th sub-groups respectively of the Q number of sub-groups of second voltage signal lines in the j-th groups respectively of the J number of groups of second voltage signal lines in the M number of stages of second voltage signal lines, the j-th second voltage signal supply line of the J number of second voltage signal supply lines in a k-th sub-group of the K number of sub-groups of second voltage signal supply lines in a q-th group of the Q number of groups of second voltage signal supply lines is electrically connected to second terminals of light emitting elements in j-th rows respectively of the J rows of light emitting elements respectively in k-th columns respectively of the K columns of light emitting elements respectively in q-th groups respectively of the Q number of groups of light emitting elements respectively from the plurality of light emitting controlling units in M rows and N columns.

Referring FIG. 4, in one example, respectively through 1st second voltage signal lines (including Nh1-1-1-1, . . . , Nh1-1-1-$m$, . . . , Nh1-1-1-M) respectively of the K number of second voltage signal lines in first sub-groups (including SG1-1-1, . . . , SG1-1-$m$, . . . , SG1-1-M) respectively of the Q number of sub-groups of second voltage signal lines in first groups (including Gh1-1, . . . , Ghm-1, . . . , GhM-1) respectively of the J number of groups of second voltage signal lines in the M number of stages (including Gh1, . . . , Ghm, . . . , GhM) of second voltage signal lines, a 1st second voltage signal supply line (Nv1-1-1) of the J number of second voltage signal supply lines in a first sub-group (SGv1-1) of the K number of sub-groups of second voltage signal supply lines in a first group (Gv-1) of the Q number of groups of second voltage signal supply lines is respectively electrically connected to second terminals of light emitting elements in first rows (e.g., r11, rm1, rM1) respectively of the J rows of light emitting elements respectively in first columns (e.g., Cs1-1 in FIG. 2) respectively of the K columns (e.g., Cs1-1, Cs2-1, CsK-1) of light emitting elements respectively in first groups (e.g., Gs-1 in FIG. 2) of the Q number of groups (e.g., Gs-1, . . . , Gs-q, . . . , Gs-Q) of light emitting elements respectively from the plurality of light emitting controlling units in M rows and N columns.

In another example, respectively through K-th second voltage signal lines (including NhK-J-Q-1, . . . , NhK-J-Q-m, . . . , NhK-J-Q-M) respectively of the K number of second voltage signal lines in Q-th sub-groups (including SGJ-Q-1, . . . , SGJ-Q-m, . . . , SGJ-Q-M) respectively of the Q number of sub-groups of second voltage signal lines in J-th groups (including Gh1-J, . . . , Ghm-J, . . . , GhM-J) respectively of the J number of groups of second voltage signal lines in the M number of stages (including Gh1, . . . , Ghm, . . . , GhM) of second voltage signal lines, a J-th second voltage signal supply line (NvK-J-Q) of the J number of second voltage signal supply lines in a K-th sub-group (SGvK-Q) of the K number of sub-groups of second voltage signal supply lines in a Q-th group (Gv-Q) of the Q number of groups of second voltage signal supply lines is electrically connected to second terminals of light emitting elements in J-th rows (e.g., r1J, rmJ, rMJ) respectively of the J rows of light emitting elements respectively in K-th columns (e.g., CsK-Q in FIG. 2) respectively of the K columns (e.g., Cs1-Q, Cs2-Q, CsK-Q) of light emitting elements respectively in Q-th groups (e.g., Gs-Q in FIG. 2) respectively of the Q number of groups (e.g., Gs-1, . . . , Gs-q, . . . , Gs-Q) of light emitting elements respectively from the plurality of light emitting controlling units in M rows and N columns.

In another example, respectively through 2nd second voltage signal lines (including Nh2-J-1-1, . . . , Nh2-J-1-$m$, . . . , Nh2-J-1-M) respectively of the K number of second voltage signal lines in first sub-groups (including SGJ-1-1, . . . , SGJ-1-$m$, . . . , SGJ-1-M) respectively of the Q number of sub-groups of second voltage signal lines in J-th groups (including Gh1-J, . . . , Ghm-J, . . . , GhM-J) respectively of the J number of groups of second voltage signal lines in the M number of stages (including Gh1, . . . , Ghm, . . . , GhM) of second voltage signal lines, a J-th second voltage signal supply line (Nv2-J-1) of the J number of second voltage signal supply lines in a second sub-group (SGv2-1) of the K number of sub-groups of second voltage signal supply lines in a first group (Gv-1) of the Q number of groups of second voltage signal supply lines is respectively electrically connected to second terminals of light emitting elements in J-th rows (e.g., r1J, rmJ, rMJ) respectively of the J rows of light emitting elements respectively in second columns (e.g., Cs2-1 in FIG. 2) respectively of the K columns (e.g., Cs1-1, Cs2-1, CsK-1) of light emitting elements respectively in first groups (e.g., Gs-1 in FIG. 2) respectively of the Q number of groups (e.g., Gs-1, . . . , Gs-q, . . . , Gs-Q) of light emitting elements respectively from the plurality of light emitting controlling units in M rows and N columns.

Referring to FIG. 2 to FIG. 4, in some embodiments, the J rows of light emitting elements in the k-th column of the K columns of light emitting elements include light emitting elements of a same color. Referring to FIG. 2, in some embodiments, the J rows of light emitting elements in first columns (e.g., Cs1-1, Cs1-$q$, Cs1-Q) of the K columns of light emitting elements of the Q number of groups (e.g., Gs-1, . . . , Gs-q, . . . , Gs-Q) are light emitting elements of a first color (e.g., red); the J rows of light emitting elements in second columns (e.g., Cs2-1, Cs2-$q$, Cs2-Q) of the K columns of light emitting elements of the Q number of groups (e.g., Gs-1, . . . , Gs-q, . . . , Gs-Q) are light emitting elements of a second color (e.g., green); and the J rows of light emitting elements in K-th columns (e.g., CsK-1, CsK-q, CsK-Q) of the K columns of light emitting elements of the Q number of groups (e.g., Gs-1, . . . , Gs-q, . . . , Gs-Q) are light emitting elements of a K-th color (e.g., blue). Optionally, K=3.

In some embodiments, the J rows of light emitting elements in the k-th column of the K columns of light emitting elements include light emitting elements of a k-th color of K number of different colors. Referring to FIG. 2, in some embodiments, the J rows of light emitting elements in first columns (e.g., Cs1-1, Cs1-$q$, Cs1-Q) of the K columns of light emitting elements of the Q number of groups (e.g., Gs-1, Gs-q, Gs-Q) are light emitting elements of a first color of K number of different colors; the J rows of light emitting elements in second columns (e.g., Cs2-1, Cs2-$q$, Cs2-Q) of the K columns of light emitting elements of the Q number of groups (e.g., Gs-1, . . . , Gs-q, . . . , Gs-Q) are light emitting elements of a second color of K number of different colors; and the J rows of light emitting elements in K-th columns (e.g., CsK-1, CsK-q, CsK-Q) of the K columns of light emitting elements of the Q number of groups (e.g., Gs-1, . . . , Gs-q, . . . , Gs-Q) are light emitting elements of a K-th color of K number of different colors. Optionally, K=3.

In some embodiments, light emitting elements in (I/K) number of columns out of the I columns of light emitting elements are of the k-th color. In some embodiments, in the at least one light emitting controlling unit, light emitting elements in a same column of the N columns of light emitting elements are of a same color. Optionally, throughout the plurality of light emitting controlling units, light emitting elements in a same column of the N columns of light emitting elements are of a same color. Optionally, color patterns in the Q number of groups of light emitting elements are the same. Optionally, color patterns in the plurality of light emitting controlling units are the same. As used herein, the term "color pattern" refers to a pattern of color(s) of light emitted by light emitting elements when lit.

In some embodiments, a total number of second voltage supply lines is I*J.

In the present light emitting substrate, light emitting elements in k-th columns respectively in q-th groups of the Q number of groups of light emitting elements respectively from the plurality of light emitting controlling units in M rows and N columns are configured to emit light simultaneously. By having this structure, a driving current can be effectively increased, and the response capacity of the driving chip can be greatly enhanced.

Figure 5:
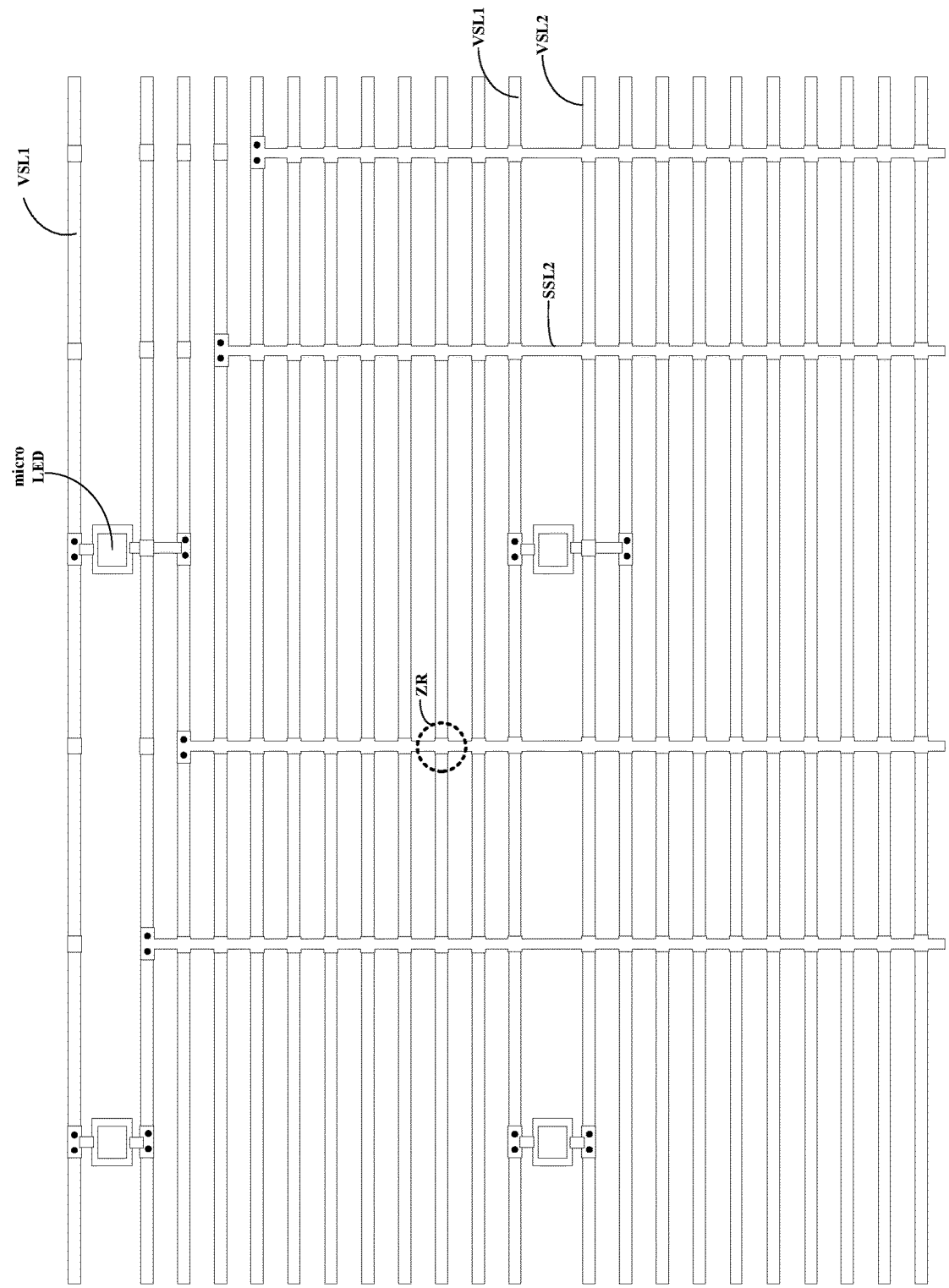
FIG. 5 is a schematic diagram illustrating the structure of a plurality of first voltage signal lines, a plurality of second voltage signal lines, a plurality of second voltage supply lines in a light emitting substrate in some embodiments according to the present disclosure.
Figure 6:
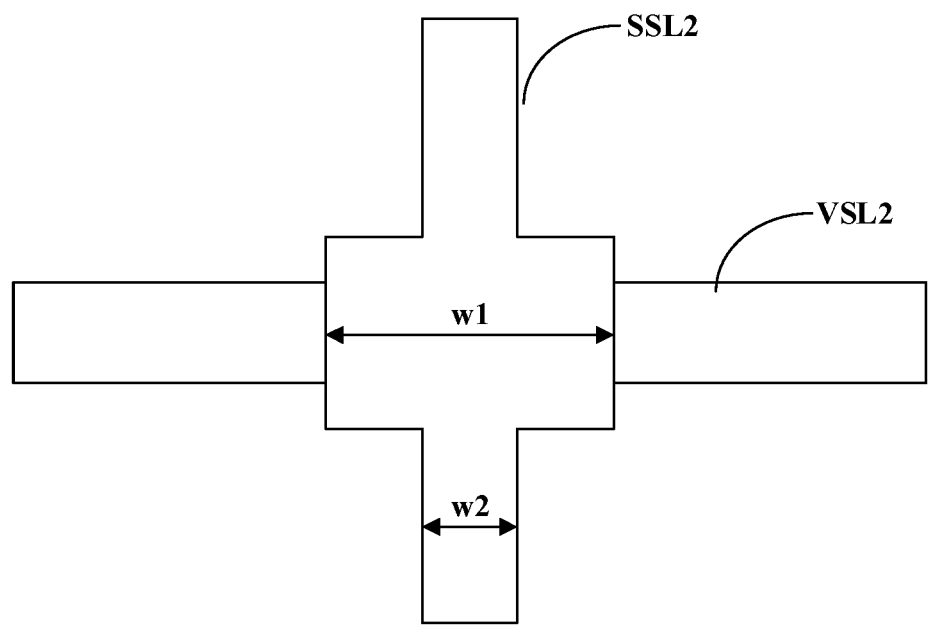
FIG. 6 is a zoom-in view of a zoom-in region in FIG. 5.

FIG. 5 is a schematic diagram illustrating the structure of a plurality of first voltage signal lines, a plurality of second voltage signal lines, a plurality of second voltage supply lines in a light emitting substrate in some embodiments according to the present disclosure. FIG. 5 shows a plurality of micro light emitting diodes (micro LED) arranged in two rows and two columns, a plurality of first voltage signal lines VSL1, a plurality of second voltage signal lines VSL2, and a plurality of second voltage supply lines SSL2. FIG. 6 is a zoom-in view of a zoom-in region in FIG. 5. As shown in FIG. 6, a respective one of the plurality of second voltage supply lines SSL2 and a respective one of the plurality of second voltage signal lines VSL2 cross over each other at a zoom-in region ZR. In a region where the respective one of the plurality of second voltage supply lines SSL2 crosses over the respective one of the plurality of second voltage signal lines VSL2, the respective one of the plurality of second voltage supply lines SSL2 has a first width w1 along an extension direction of the respective one of the plurality of second voltage signal lines VSL2. In a region outside of where the respective one of the plurality of second voltage supply lines SSL2 crosses over the respective one of the plurality of second voltage signal lines VSL2, the respective one of the plurality of second voltage supply lines SSL2 has a second width w2 along the extension direction of the respective one of the plurality of second voltage signal lines VSL2. Optionally, the first width w1 is greater than the second width w2. By having the first width w1 greater than the second width w2, a line open defect in the respective one of the plurality of second voltage supply lines SSL2 in the region where the respective one of the plurality of second voltage supply lines SSL2 crosses over the respective one of the plurality of second voltage signal lines VSL2 can be prevented.

Figure 7:
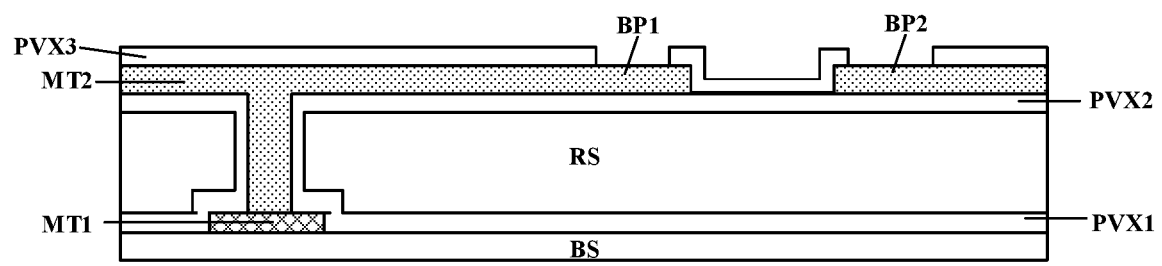
FIG. 7 is a schematic diagram illustrating the structure of a back plate for bonding micro LED of a light emitting substrate in some embodiments according to the present disclosure.

FIG. 7 is a schematic diagram illustrating the structure of a back plate for bonding micro LED of a light emitting substrate in some embodiments according to the present disclosure. Referring to FIG. 7, the back plate in some embodiments includes a base substrate BS, a first metal layer MT1 on the base substrate BS, a first passivation layer PVX1 on a side of the first metal layer MT1 away from the base substrate BS, a resin layer RS on a side of the first passivation layer PVX1 away from the base substrate BS, a second passivation layer PVX2 on a side of the resin layer RS away from the base substrate BS, a second metal layer MT2 on a side of the second passivation layer PVX2 away from the base substrate BS, and a third passivation layer PVX3 on a side of the second metal layer MT2 away from the base substrate BS. The second metal layer MT2 connects to the first meal layer MT through a via extending through the second passivation layer PVX2, the resin layer RS, and the first passivation layer PVX1.

In some embodiments, the light emitting substrate includes a base substrate BS, a first metal layer MT1 and a second metal layer MT2 on the base substrate BS; and at least one insulating layer spacing apart the first metal layer MT1 from the second metal layer MT2.

In some embodiments, the at least one insulating layer includes a resin layer RS.

In some embodiments, the at least one insulating layer further includes a first passivation layer PVX1 between the resin layer RS and the first metal layer MT1, and a second passivation layer PVX2 between the resin layer RS and the second metal layer MT2.

In some embodiments, the light emitting substrate further includes a third passivation layer PVX3 on a side of the second metal layer MT2 away from the base substrate BS; and at least two vias extending through the third passivation layer PVX3 and partially exposing a surface of the second metal layer MT2.

Portions of the second metal layer MT2 can serve as a first bonding pad BP1 and a second bonding pad BP2 for bonding a micro LED. In one example, the first metal layer MT1 and the second metal layer MT2 are made of copper or copper-containing metallic material. On top of the first bonding pad BP1 and the second bonding pad BP2, in some embodiments, nickel gold may be formed using a nickelized gold process, and subsequently indium metal may be plated on top of the nickel gold. Typically, the micro LED electrode is made of a gold material, which has an excellent bonding affinity with the indium material on the first bonding pad BP1 and the second bonding pad BP2.

In some embodiments, each of the first metal layer MT1 and the second metal layer MT2 includes copper. Optionally, the second metal layer MT2 further includes nickel gold on the surface partially exposed by the at least two vias. Optionally, the second metal layer MT2 further includes indium tin oxide on the surface partially exposed by the at least two vias.

A front light source is placed on top of a reflective-type display panel. The first passivation layer PVX1 and the second passivation layer PVX2 prevent oxidation of the first meal layer MT1 or the second metal layer MT2 by the resin layer RS. The resin layer RS can reduce overall load of the front light source by reducing coupling capacitance between the first metal layer MT1 and the second metal layer MT2. Moreover, the presence of the second resin layer RS2 can ensure a surface for bonding micro LED is substantially even. The third passivation layer PVX3 prevents bubbling of electrode material (e.g., the second metal layer MT2) in the front light source.

In some embodiments, the back plate further includes an indium tin oxide layer on a side of the third passivation layer PVX3 and the second metal layer MT2 away from the base substrate BS. The indium tin oxide layer is used for bonding a flexible printed circuit. The third passivation layer PVX3 prevents surface fogging of the indium tin oxide layer.

Figure 8:
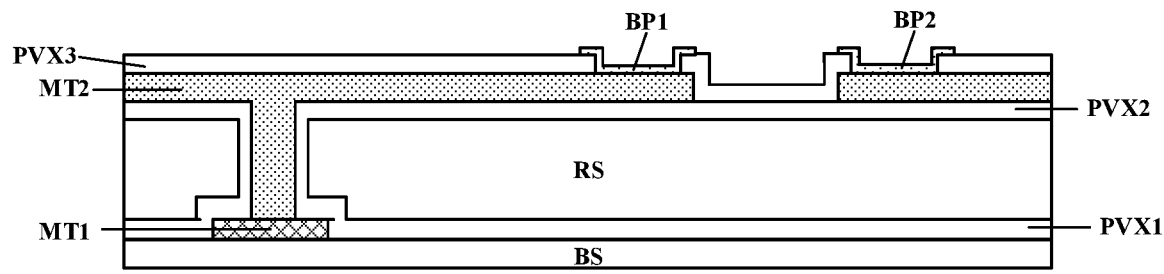
FIG. 8 is a schematic diagram illustrating the structure of a back plate for bonding micro LED of a light emitting substrate in some embodiments according to the present disclosure.

FIG. 8 is a schematic diagram illustrating the structure of a back plate for bonding micro LED of a light emitting substrate in some embodiments according to the present disclosure. Referring to FIG. 8, the back plate includes a first bonding pad BP1 and a second bonding pad BP2 made of indium tin oxide. The first bonding pad BP1 and the second bonding pad BP2 are respectively connected to the second metal layer MT2 respectively through vias extending through the fourth passivation layer PVX4.

Figure 9:
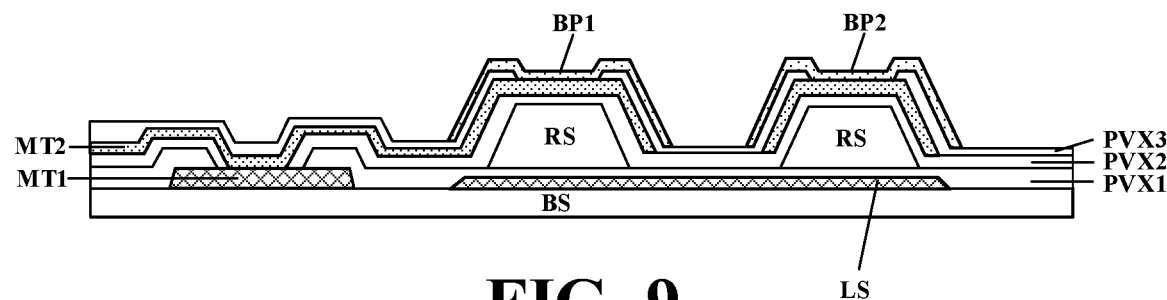
FIG. 9 is a schematic diagram illustrating the structure of a back plate for bonding micro LED of a light emitting substrate in some embodiments according to the present disclosure.

FIG. 9 is a schematic diagram illustrating the structure of a back plate for bonding micro LED of a light emitting substrate in some embodiments according to the present disclosure. Referring to FIG. 9, the resin layer RS in some embodiments in limited to the LED bonding region. In one example, orthographic projections of the first bonding pad BP1 and the second bonding pad BP2 on the base substrate BS covers an orthographic projection of the resin layer RS on the base substrate BS. In some embodiments, the light emitting substrate further includes a light shielding layer LS configured to block light emitted from the micro LED toward the base substrate BS. Optionally, the light shielding layer LS is in a same layer as the first metal layer MT1. Optionally, the light shielding layer LS is a pattern that is distinct from other patterns (e.g., the first metal layer MT1) in the same layer. For example, the light shielding layer LS is spaced apart from any portion of the first metal layer MT1. In another example, an orthographic projection of the light shielding layer LS on the base substrate BS is non-overlapping with an orthographic projection of the first metal layer MT1 on the base substrate BS.

Figure 10:
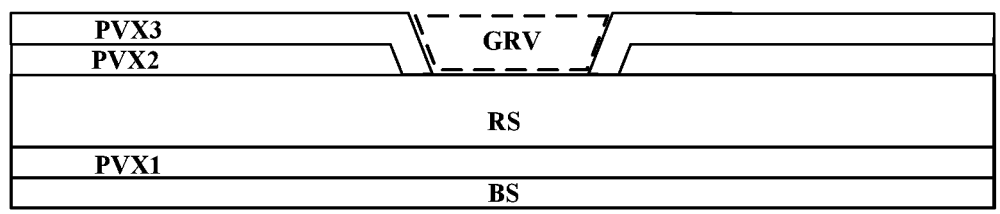
FIG. 10 is a cross-sectional view intersecting a gas releasing via.

In some embodiments, the resin layer RS is not limited in the LED bonding region (e.g., instead disposed throughout the entire area of the light emitting substrate), and the light emitting substrate further includes at least one gas releasing via to prevent gas defect during a high temperature manufacturing process. FIG. 10 is a cross-sectional view intersecting a gas releasing via. Referring to FIG. 10, the gas releasing via GRV in some embodiments extends through the third passivation layer PVX3 and the second passivation layer PVX2, exposing a surface of the resin layer RS. The resin layer RS optionally is made of an organic material, prone to release gas during a high-temperature process. The first passivation layer PVX1, the second passivation layer PVX2, and the third passivation layer PVX3 optionally are made of an inorganic material. Without the gas releasing via GRV, the gas released by the resin layer RS may cause burst in one or more of the passivation layers, resulting in rupture. Optionally, the light emitting substrate further includes a plurality of gas releasing vias arranged in an array.

Referring to FIGS. 5, 7, 8, and 9, the signal lines along the row direction may be a part of the second metal layer MT2, and the signal lines along the column direction may be a part of the first metal layer MT1.

Figure 11:
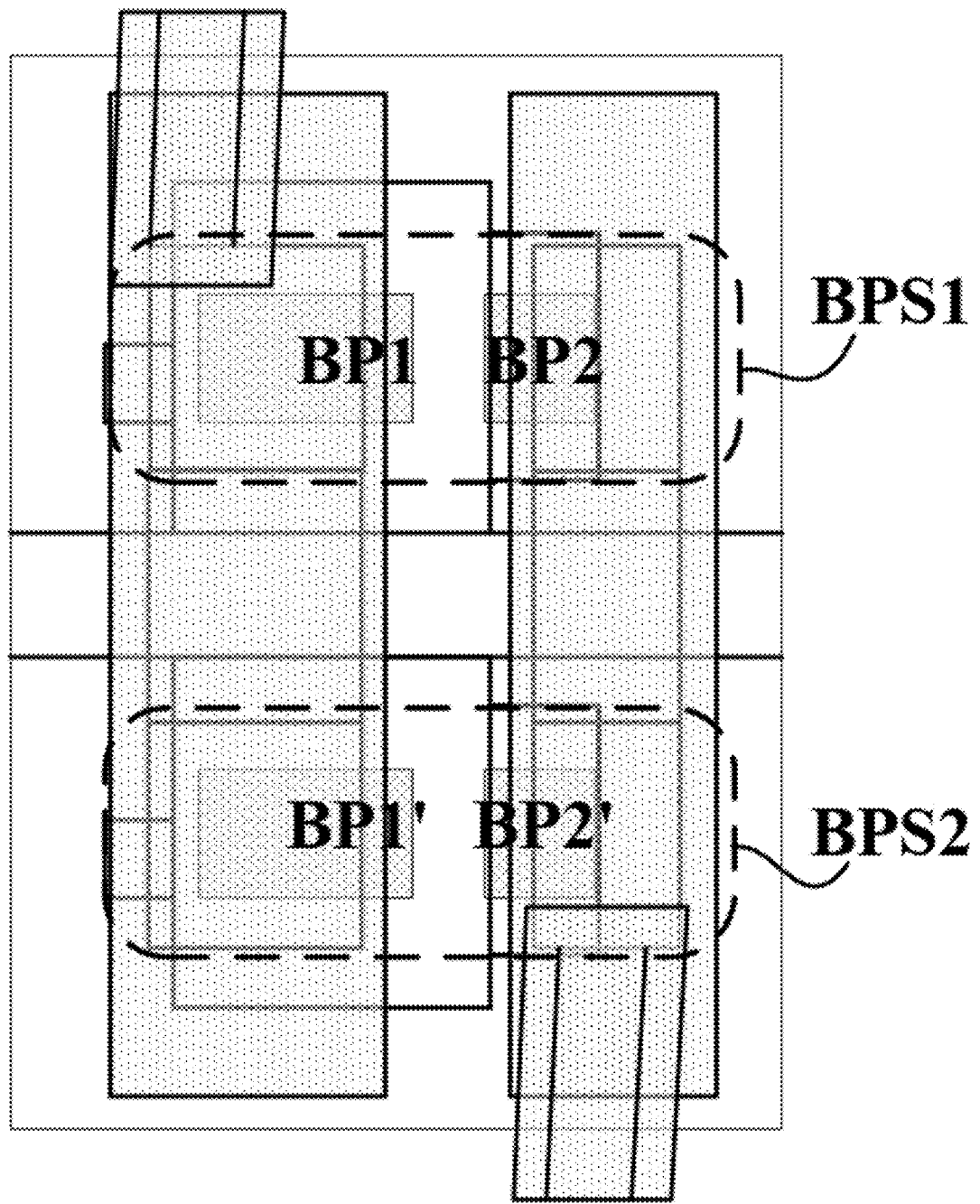
FIG. 11 is a zoom-in view of a LED bonding point in a light emitting substrate in some embodiments according to the present disclosure.

FIG. 11 is a zoom-in view of a LED bonding point in a light emitting substrate in some embodiments according to the present disclosure. Referring to FIG. 11, the LED bonding point LEDB includes a first set of bonding pads BPS1 and a second set of bonding pads BPS2. In one example, the first set of bonding pads BPS1 includes a first bonding pad BP1 and a second bonding pad BP2; and the second set of bonding pads BPS2 includes a third bonding pad BP1' and a fourth bonding pad BP2'. By having an additional set of bonding pads, when one of the two sets is defective, the micro LED bonded to the LED bonding point can still work.

In another aspect, the present disclosure provides a display apparatus. In some embodiments, the display apparatus includes the light emitting substrate described herein or fabricated by a method described herein, a display panel, and an integrated circuit connected to the display panel. Optionally, the display panel is a reflective-type display panel.

The present light emitting substrate enables a direct-lit type front light source for the reflective-type display panel. In the present display apparatus, the present light emitting substrate is placed in front of the reflective-type display panel (on a display side of the display panel) to achieve the image display. Moreover, the present light emitting substrate enables a virtual reality image display when combined with the reflective-type display panel.

Figure 12:
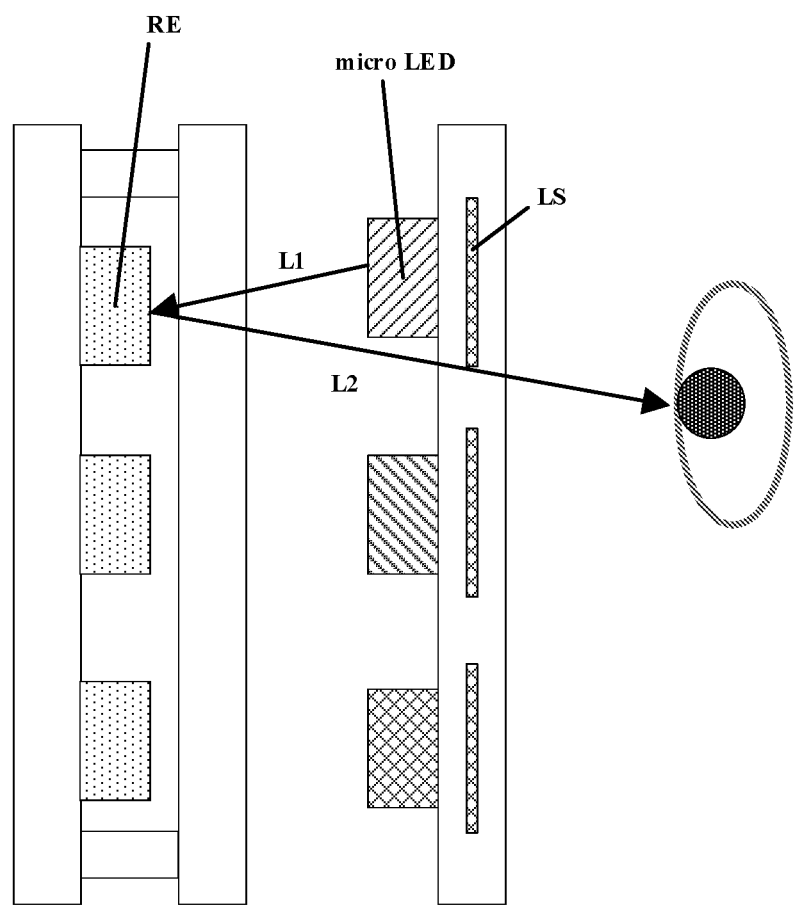
FIG. 12 illustrates a working principle of a reflective-type display apparatus in some embodiments according to the present disclosure.

FIG. 12 illustrates a working principle of a reflective-type display apparatus in some embodiments according to the present disclosure. Referring to FIG. 12, light L1 emitted from micro LED of the light emitting substrate is reflected by a reflective electrode RE in the reflective-type display panel, the reflected light L1 is transmitted to a viewer's eye. The light emitting substrate includes a light shielding layer LS to prevent light emitted from the micro LED to interfere with light reflected by the reflective-type display panel, thereby enhancing display quality.

In some embodiments, the metal lines along the row direction and the metal lines (or black matrix lines) along the column direction cross over each other at an angle that is not 90 degrees. Typically, the metal lines in the reflective display panel respectively along the row direction and along the columns are perpendicular to each other. By having the metal lines in the light emitting substrate along the row direction and the metal lines along the column direction cross over each other at an angle that is not 90 degrees, Moire pattern can be avoided or reduced.

In one example, the metal lines along the row direction in the light emitting substrate are substantially parallel to the metal lines along the row direction in the reflective display panel; whereas the metal lines along the column direction in the light emitting substrate are not parallel to the metal lines along the column direction in the reflective display panel (e.g., at an angle that is not zero).

In another example, the metal lines along the column direction in the light emitting substrate are substantially parallel to the metal lines along the column direction in the reflective display panel; whereas the metal lines along the row direction in the light emitting substrate are not parallel to the metal lines along the row direction in the reflective display panel (e.g., at an angle that is not zero).

In some embodiments, the light emitting substrate includes a plurality of signal lines. In some embodiments, the plurality of signal lines includes multiple signal lines extending along a first direction and multiple signal lines extending along a second direction, the second direction being different from the first direction. Optionally, the multiple signal lines extending along the first direction are parts of one of the first metal layer MT1 and the second metal layer MT2. Optionally, the multiple signal lines extending along the second direction are parts of another of the first metal layer MT1 and the second metal layer MT2.

In some embodiments, the multiple signal lines extending along the first direction comprise second voltage signal lines. Optionally, the multiple signal lines extending along the second direction comprise first voltage signal lines.

In some embodiments, the reflective-type display panel includes a plurality of first signal lines and a plurality of second signal lines. The light emitting substrate includes a plurality of signal lines. Optionally, the plurality of signal lines comprise multiple signal lines extending along a first direction and multiple signal lines extending along a second direction, the second direction being different from the first direction. Optionally, the multiple signal lines extending along the first direction cross over the plurality of first signal lines at an angle greater than zero and less than 20 degrees, and/or the multiple signal lines extending along the second direction cross over the plurality of second signal lines at an angle greater than zero and less than 20 degrees. Optionally, the plurality of first signal lines are a plurality of data lines and the plurality of second signal lines are a plurality of gate lines. Optionally, the plurality of first signal lines are a plurality of gate lines and the plurality of second signal lines are a plurality of data lines.

In another aspect, the present disclosure provides a method of driving a light emitting substrate. In some embodiments, the light emitting substrate includes a plurality of light emitting controlling units arranged in M rows and N columns, M is an integer equal to or greater than one, N is an integer equal to or greater than one, wherein a respective one of the plurality of light emitting controlling units includes a plurality of light emitting elements arranged in J rows and I columns, J being an integer equal to or greater than one, I being an integer equal to or greater than one, a i-th column of the I columns of light emitting elements comprises J rows of light emitting elements, 1≤i≤I. In some embodiments, the method includes electrically connecting first terminals of light emitting elements in a respective row of light emitting elements to a respective first voltage signal line of (M×J) number of first voltage signal lines; electrically connecting second terminals of light emitting elements in the respective row of light emitting elements to I number of second voltage signal lines in a respective group of second voltage signal lines of (M×J) number of groups of second voltage signal lines; providing a first voltage signal to the first terminals; and providing a second voltage signal to a respective one of the second terminals.

In some embodiments, the respective one of the plurality of light emitting controlling units comprises Q number of groups of light emitting elements, a respective group of the Q number of groups of light emitting elements comprises K columns of light emitting elements, the respective group of second voltage signal lines comprises Q number of sub-groups of second voltage signal lines, a respective sub-group of the Q number of sub-groups of second voltage signal lines comprising K number of second voltage signal lines, Q being an integer equal to or greater than one, K being an integer equal to or greater than one. In some embodiments, the method further includes J rows of light emitting elements in a k-th column of the K columns of light emitting elements, 1≤k≤K, and I=K*Q; in the respective row of light emitting elements, electrically connecting second terminals of light emitting elements in k-th columns respectively in q-th groups of the Q number of groups of light emitting elements respectively from N number of light emitting controlling units in a same row to a k-th second voltage signal line of the K number of second voltage signal lines in a q-th sub-group of the Q number of sub-groups of second voltage signal lines in the respective group of second voltage signal lines, 1≤q≤Q; and time-sequentially providing second voltage signals to the K number of second voltage signal lines.

In some embodiments, the (M×J) number of groups of second voltage signal lines comprises M number of stages of second voltage signal lines, a respective stage of the M number of stages of second voltage signal lines comprises J number of groups of second voltage signal lines, a respective group of the J number of groups of second voltage signal lines comprises Q number of sub-groups of second voltage signal lines, a respective sub-group of the Q number of sub-groups of second voltage signal lines comprises K number of second voltage signal lines. In some embodiments, the method further includes respectively electrically connecting second terminals of light emitting elements in k-th columns respectively in q-th groups of the Q number of groups of light emitting elements respectively from N number of light emitting controlling units in a m-th row of the plurality of light emitting controlling units to a k-th second voltage signal line of the K number of second voltage signal lines in a q-th sub-group of the Q number of sub-groups of second voltage signal lines in a j-th group of the J number of groups of second voltage signal lines in a m-th stage of the M number of stages of second voltage signal lines; and time-sequentially providing second voltage signals to the K number of second voltage signal lines in the q-th sub-group of the Q number of sub-groups of second voltage signal lines in the j-th group of the J number of groups of second voltage signal lines in the m-th stage of the M number of stages of second voltage signal lines.

In some embodiments, the light emitting substrate further includes I*J number of second voltage signal supply lines; and the I number of second voltage signal lines in the respective group of second voltage signal lines are respectively connected to a set of I number of second voltage signal supply lines out of the I*J number of second voltage signal supply lines. In some embodiments, the method further includes respectively connecting the I number of second voltage signal lines in the respective group of second voltage signal lines to the set of I number of second voltage signal supply lines out of the I*J number of second voltage signal supply lines; and providing second voltage signals respectively from the I number of second voltage signal supply lines in the set to the I number of second voltage signal lines in the respective group of second voltage signal lines.

In some embodiments, the I*J number of second voltage signal supply lines are grouped into Q number of groups of second voltage signal supply lines, Q being an integer equal to or greater than one, a respective group of the Q number of groups of second voltage signal supply lines comprises K number of sub-groups of second voltage signal supply lines, K being an integer equal to or greater than one, a respective sub-group of the K number of sub-groups of second voltage signal supply lines comprises J number of second voltage signal supply lines. In some embodiments, the method further includes time-sequentially providing second voltage signals to the K number of sub-groups of second voltage signal supply lines one sub-group by one-group.

In some embodiments, the (M×J) number of groups of second voltage signal lines comprises M number of stages of second voltage signal lines, a respective stage of the M number of stages of second voltage signal lines comprises J number of groups of second voltage signal lines, a respective group of the J number of groups of second voltage signal lines comprises Q number of sub-groups of second voltage signal lines, a respective sub-group of the Q number of sub-groups of second voltage signal lines comprises K number of second voltage signal lines. In some embodiments, the method further includes respectively electrically connecting k-th second voltage signal lines respectively of the K number of second voltage signal lines in q-th sub-groups respectively of the Q number of sub-groups of second voltage signal lines in j-th groups respectively of the J number of groups of second voltage signal lines in the M number of stages of second voltage signal lines to a j-th second voltage signal supply line of the J number of second voltage signal supply lines in a k-th sub-group of the K number of sub-groups of second voltage signal supply lines in a q-th group of the Q number of groups of second voltage signal supply lines; and time-sequentially providing second voltage signals to the K number of second voltage signal lines in the q-th sub-groups respectively of the Q number of sub-groups of second voltage signal lines in the j-th groups respectively of the J number of groups of second voltage signal lines in the M number of stages of second voltage signal lines.

In some embodiments, the respective one of the plurality of light emitting controlling units comprises Q number of groups of light emitting elements, Q being an integer equal to or greater than one, a respective group of the Q number of groups of light emitting elements comprises K columns of light emitting elements, K being an integer equal to or greater than one, a k-th column of the K columns of light emitting elements comprises J rows of light emitting elements, $1 \leq k \leq K$, and $I=K*Q$. In some embodiments, the method further includes, respectively through the k-th second voltage signal lines respectively of the K number of second voltage signal lines in the q-th sub-groups respectively of the Q number of sub-groups of second voltage signal lines in the j-th groups respectively of the J number of groups of second voltage signal lines in the M number of stages of second voltage signal lines, electrically connecting the j-th second voltage signal supply line of the J number of second voltage signal supply lines in a k-th sub-group of the K number of sub-groups of second voltage signal supply lines in a q-th group of the Q number of groups of second voltage signal supply lines to second terminals of light emitting elements in k-th columns respectively in q-th groups of the Q number of groups of light emitting elements respectively from the plurality of light emitting controlling units in M rows and N columns; and time-sequentially providing second voltage signals to the K number of sub-groups of second voltage signal supply lines in a q-th group of the Q number of groups of second voltage signal supply lines.

In the present driving method, light emitting elements in k-th columns respectively in q-th groups of the Q number of groups of light emitting elements respectively from the plurality of light emitting controlling units in M rows and N columns are configured to emit light simultaneously. By having this driving method, a driving current can be effectively increased, and the response capacity of the driving chip can be greatly enhanced.

In some embodiments, the J rows of light emitting elements in the k-th column of the K columns of light emitting elements include light emitting elements of a same color. In some embodiments, the J rows of light emitting elements in first columns of the K columns of light emitting elements of the Q number of groups are light emitting elements of a first color (e.g., red); the J rows of light emitting elements in second columns of the K columns of light emitting elements of the Q number of groups are light emitting elements of a second color (e.g., green); and the J rows of light emitting elements in K-th columns of the K columns of light emitting elements of the Q number of groups are light emitting elements of a K-th color (e.g., blue). Optionally, K=3. By having the present driving method, light emitting elements of a same color and in a same respective position respectively in the plurality of light emitting controlling units are configured to emit light simultaneously.

In another aspect, the present disclosure further provides a method of fabricating a light emitting substrate. In some embodiments, the method includes forming a plurality of light emitting controlling units arranged in M rows and N columns, M is an integer equal to or greater than one, N is an integer equal to or greater than one, wherein a respective one of the plurality of light emitting controlling units comprises a plurality of light emitting elements arranged in J rows and I columns, J being an integer equal to or greater than one, I being an integer equal to or greater than one, a i-th column of the I columns of light emitting elements comprises J rows of light emitting elements, $1 \leq i \leq I$; forming (M×J) number of first voltage signal lines; and forming (M×J) number of groups of second voltage signal lines. In some embodiments, forming the plurality of light emitting controlling units includes transferring micro light emitting diodes onto a back panel in which the (M×J) number of first voltage signal lines and the (M×J) number of groups of second voltage signal lines are formed; electrically connecting first terminals of micro light emitting diodes in a respective row of light emitting elements to a respective first voltage signal line of the (M×J) number of first voltage signal lines; and electrically connecting second terminals of micro light emitting diodes in the respective row of light emitting elements to I number of second voltage signal lines in a respective group of second voltage signal lines of the (M×J) number of groups of second voltage signal lines.

Figure 13:
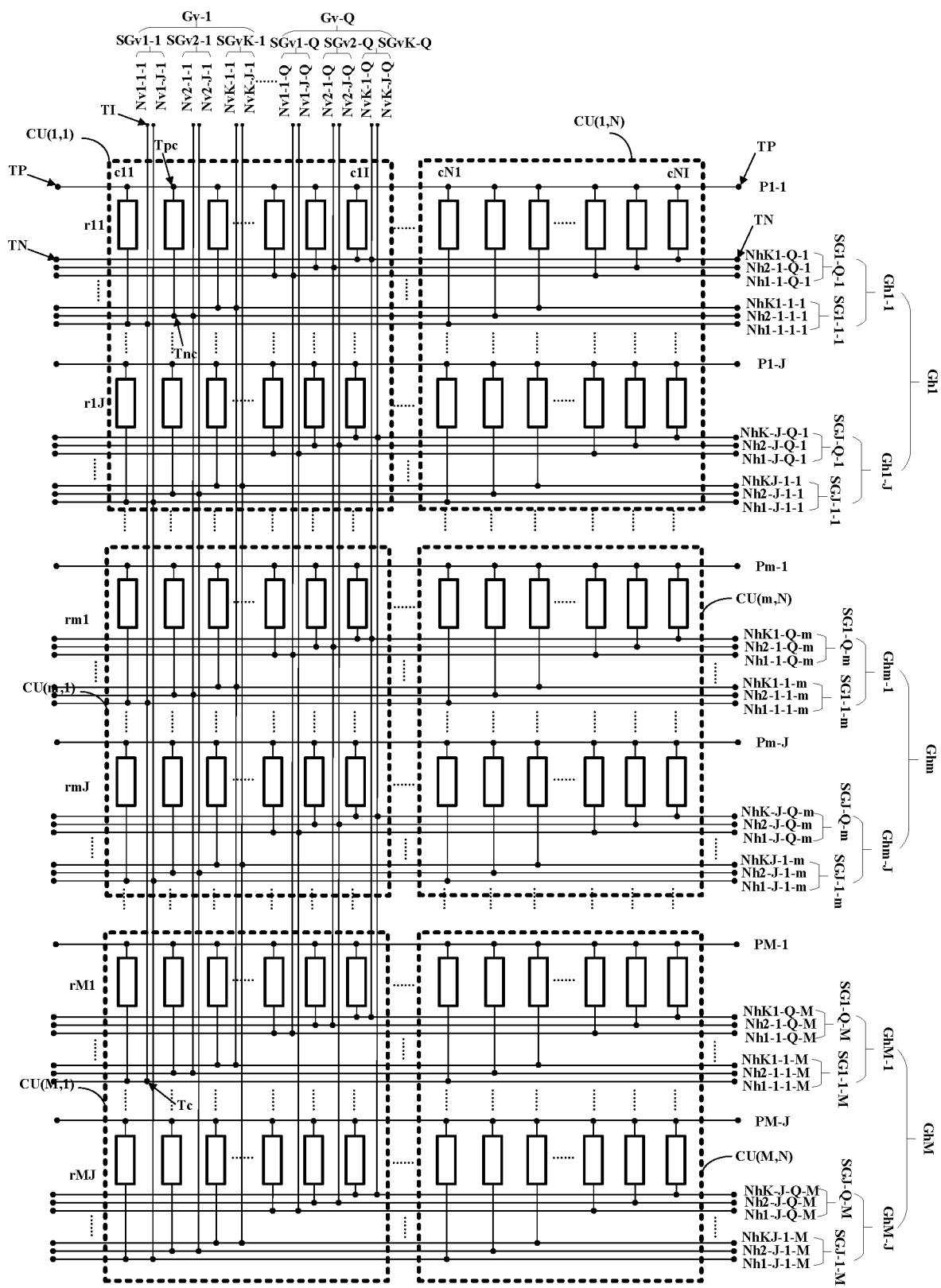
FIG. 13 is a schematic diagram illustrating the structure of a light emitting substrate before micro light emitting diodes are transferred thereto in some embodiments according to the present disclosure.

FIG. 13 is a schematic diagram illustrating the structure of a light emitting substrate before micro light emitting diodes are transferred thereto in some embodiments according to the present disclosure. Referring to FIG. 13, a respective first voltage signal line (e.g., P1-1) has two opposite terminals TP, a respective second voltage signal line (e.g., NhK1-Q-1) has two opposite terminals TN; a respective second voltage signal supply line (e.g., Nv1-1-1) extends from a respective one of I number of input terminals TI to a respective one of I number of connecting terminals Tc. Optionally, a respective subpixel is electrically connected to a respective first voltage signal line at a first connecting terminal Tpc, and electrically connected to a respective second voltage signal line at a second connecting terminal Tnc.

In some embodiments, prior to transferring the micro light emitting diodes onto the back panel, the method further includes at least one of measuring a resistance between two opposite terminals TP of a respective first voltage signal line; measuring a resistance between two opposite terminals TN of a respective second voltage signal line; or measuring a resistance between a respective terminal (one of the two opposite terminals TP) of the respective first voltage signal line and a respective terminal (one of the two opposite terminals TN) of the respective second voltage signal line. By measuring a resistance between two opposite terminals TP of a respective first voltage signal line, a line open in the respective first voltage signal line may be detected. By measuring a resistance between two opposite terminals TN of a respective second voltage signal line, a line open in the respective second voltage signal line may be detected. By measuring a resistance between a respective terminal of the respective first voltage signal line and a respective terminal of the respective second voltage signal line, a short between the respective first voltage signal line and the respective second voltage signal line may be detected.

In some embodiments, prior to transferring the micro light emitting diodes onto the back panel, the method further includes forming I*J number of second voltage signal supply lines; and respectively connecting the I number of second voltage signal lines in a respective group of second voltage signal lines to a set of I number of second voltage signal supply lines (out of the I*J number of second voltage signal supply lines) respectively at I number of connecting terminals, wherein the I number of second voltage signal supply lines in the set respectively extend from I number of input terminals to the I number of connecting terminals.

In some embodiments, prior to transferring the micro light emitting diodes onto the back panel, the method further includes measuring a resistance between two of the I number of input terminals. By measuring a resistance between two of the I number of input terminals, a short between two of the I number of second voltage signal lines may be detected.

In some embodiments, prior to transferring the micro light emitting diodes onto the back panel, the method further includes measuring a resistance between a respective input terminal of a respective second voltage signal supply line and a respective terminal of a respective second voltage signal line. By measuring a resistance between a respective input terminal of a respective second voltage signal supply line and a respective terminal of a respective second voltage signal line, a connectivity between the respective second voltage signal supply line and the respective second voltage signal line can be determined. In one example, the respective second voltage signal supply line is configured to provide a second voltage signal to the respective second voltage signal line, however, if a line open is detected by measuring the resistance between the respective input terminal of a respective second voltage signal supply line and the respective terminal of a respective second voltage signal line, it indicates that two metal layers at a position of a respective connecting terminal of the respective second voltage signal supply line are not connected. In another example, the respective second voltage signal supply line is not configured to provide a second voltage signal to the respective second voltage signal line, by measuring the resistance between the respective input terminal of a respective second voltage signal supply line and the respective terminal of a respective second voltage signal line, a short between the respective second voltage signal supply line and the respective second voltage signal line may be detected.

In some embodiments, prior to transferring the micro light emitting diodes onto the back panel, the method further includes measuring a resistance between a first connecting terminal Tpc and a second connecting terminal Tnc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:
1. A light emitting substrate, comprising:
a plurality of light emitting controlling units arranged in M rows and N columns, M is an integer equal to or greater than one, N is an integer equal to or greater than one, wherein a respective one of the plurality of light emitting controlling units comprises a plurality of light emitting elements arranged in J rows and I columns, J being an integer equal to or greater than one, I being an integer equal to or greater than one, a i-th column of the I columns of light emitting elements comprises J rows of light emitting elements, $1 \leq i \leq I$;
(M×J) number of first voltage signal lines; and
(M×J) number of groups of second voltage signal lines;
wherein first terminals of light emitting elements in a respective row of light emitting elements are electrically connected to a respective first voltage signal line of the (M×J) number of first voltage signal lines;
second terminals of light emitting elements in the respective row of light emitting elements are respectively connected to I number of second voltage signal lines in a respective group of second voltage signal lines of the (M×J) number of groups of second voltage signal lines;
the respective one of the plurality of light emitting controlling units comprises Q number of groups of light emitting elements, Q being an integer equal to or greater than one;
a respective group of the Q number of groups of light emitting elements comprises K columns of light emitting elements, K being an integer equal to or greater than one;
a k-th column of the K columns of light emitting elements comprises J rows of light emitting elements, $1 \leq k \leq K$, and I=K*Q;
the respective group of second voltage signal lines comprises Q number of sub-groups of second voltage signal lines, a respective sub-group of the Q number of sub-groups of second voltage signal lines comprising K number of second voltage signal lines; and
in the respective row of light emitting elements, second terminals of light emitting elements in k-th columns respectively in q-th groups of the Q number of groups of light emitting elements respectively from N number of light emitting controlling units in a same row are electrically connected to a k-th second voltage signal line of the K number of second voltage signal lines in a q-th sub-group of the Q number of sub-groups of second voltage signal lines in the respective group of second voltage signal lines, $1 \leq q \leq Q$;
wherein light emitting elements in the k-th column of the K columns of light emitting elements in the Q number of groups of light emitting elements comprise light emitting elements of a same color.

2. The light emitting substrate of claim 1, wherein the (M×J) number of groups of second voltage signal lines comprise M number of stages of second voltage signal lines;
   a respective stage of the M number of stages of second voltage signal lines comprises J number of groups of second voltage signal lines;
   a respective group of the J number of groups of second voltage signal lines comprises Q number of sub-groups of second voltage signal lines;
   a respective sub-group of the Q number of sub-groups of second voltage signal lines comprises K number of second voltage signal lines; and
   second terminals of light emitting elements in k-th columns respectively in q-th groups of the Q number of groups of light emitting elements respectively from N number of light emitting controlling units in a m-th row of the plurality of light emitting controlling units are respectively electrically connected to a k-th second voltage signal line of the K number of second voltage signal lines in a q-th sub-group of the Q number of sub-groups of second voltage signal lines in a j-th group of the J number of groups of second voltage signal lines in a m-th stage of the M number of stages of second voltage signal lines.

3. The light emitting substrate of claim 1, further comprising I*J number of second voltage signal supply lines; and
   the I number of second voltage signal lines in the respective group of second voltage signal lines are respectively connected to a set of I number of second voltage signal supply lines.

4. The light emitting substrate of claim 3, wherein the I*J number of second voltage signal supply lines are grouped into Q number of groups of second voltage signal supply lines, Q being an integer equal to or greater than one;
   a respective group of the Q number of groups of second voltage signal supply lines comprises K number of sub-groups of second voltage signal supply lines, K being an integer equal to or greater than one; and
   a respective sub-group of the K number of sub-groups of second voltage signal supply lines comprises J number of second voltage signal supply lines.

5. The light emitting substrate of claim 4, wherein the (M×J) number of groups of second voltage signal lines comprises M number of stages of second voltage signal lines;
   a respective stage of the M number of stages of second voltage signal lines comprises J number of groups of second voltage signal lines;
   a respective group of the J number of groups of second voltage signal lines comprises Q number of sub-groups of second voltage signal lines;
   a respective sub-group of the Q number of sub-groups of second voltage signal lines comprises K number of second voltage signal lines; and
   k-th second voltage signal lines respectively of the K number of second voltage signal lines in q-th sub-groups respectively of the Q number of sub-groups of second voltage signal lines in j-th groups respectively of the J number of groups of second voltage signal lines in the M number of stages of second voltage signal lines are respectively electrically connected to a j-th second voltage signal supply line of the J number of second voltage signal supply lines in a k-th sub-group of the K number of sub-groups of second voltage signal supply lines in a q-th group of the Q number of groups of second voltage signal supply lines.

6. The light emitting substrate of claim 5, wherein the respective one of the plurality of light emitting controlling units comprises Q number of groups of light emitting elements, Q being an integer equal to or greater than one;
   a respective group of the Q number of groups of light emitting elements comprises K columns of light emitting elements, K being an integer equal to or greater than one;
   a k-th column of the K columns of light emitting elements comprises J rows of light emitting elements, $1 \leq k \leq K$, and $I=K*Q$;
   respectively through the k-th second voltage signal lines respectively of the K number of second voltage signal lines in the q-th sub-groups respectively of the Q number of sub-groups of second voltage signal lines in the j-th groups respectively of the J number of groups of second voltage signal lines in the M number of stages of second voltage signal lines, the j-th second voltage signal supply line of the J number of second voltage signal supply lines in a k-th sub-group of the K number of sub-groups of second voltage signal supply lines in a q-th group of the Q number of groups of second voltage signal supply lines is electrically connected to second terminals of light emitting elements in k-th columns respectively in q-th groups of the Q number of groups of light emitting elements respectively from the plurality of light emitting controlling units in M rows and N columns.

7. The light emitting substrate of claim 1, wherein the J rows of light emitting elements in the k-th column of the K columns of light emitting elements comprise light emitting elements of a k-th color of K number of different colors;
   light emitting elements in (I/K) number of columns out of the I columns of light emitting elements are of the k-th color; and
   light emitting elements in a same column of the I columns of light emitting elements are of a same color.

8. The light emitting substrate of claim 1, wherein color patterns in the Q number of groups of light emitting elements are the same.

9. The light emitting substrate of claim 1, wherein K=3.

10. The light emitting substrate of claim 1, wherein color patterns in the plurality of light emitting controlling units are the same.

11. The light emitting substrate of claim 1, comprising:
    a base substrate;
    a first metal layer and a second metal layer on the base substrate; and
    at least one insulating layer spacing apart the first metal layer from the second metal layer.

12. The light emitting substrate of claim 11, further comprising a plurality of signal lines;
    wherein the plurality of signal lines comprise multiple signal lines extending along a first direction and multiple signal lines extending along a second direction, the second direction being different from the first direction;
    the multiple signal lines extending along the first direction are parts of one of the first metal layer and the second metal layer; and
    the multiple signal lines extending along the second direction are parts of another of the first metal layer and the second metal layer.

13. The light emitting substrate of claim 12, wherein the multiple signal lines extending along the first direction comprise second voltage signal lines; and the multiple signal lines extending along the second direction comprise first voltage signal lines.

14. The light emitting substrate of claim 13, wherein the at least one insulating layer comprises a resin layer.

15. The light emitting substrate of claim 14, wherein the at least one insulating layer further comprises a first passivation layer between the resin layer and the first metal layer, and a second passivation layer between the resin layer and the second metal layer.

16. The light emitting substrate of claim 15, further comprising a third passivation layer on a side of the second metal layer away from the base substrate; and at least two vias extending through the third passivation layer and partially exposing a surface of the second metal layer.

17. A display apparatus, comprising the light emitting substrate of claim 1, a reflective-type display panel, and an integrated circuit connected to the reflective-type display panel;

wherein the light emitting substrate is on a display side of the reflective-type display panel.

18. The light emitting substrate of claim 1, wherein the J rows of light emitting elements in first columns of the K columns of light emitting elements of the Q number of groups are light emitting elements of a first color;

the J rows of light emitting elements in second columns of the K columns of light emitting elements of the Q number of groups are light emitting elements of a second color; and the J rows of light emitting elements in K-th columns of the K columns of light emitting elements of the Q number of groups are light emitting elements of a K-th color.

19. A method of driving a light emitting substrate comprising a plurality of light emitting controlling units arranged in M rows and N columns, M is an integer equal to or greater than one, N is an integer equal to or greater than one, wherein a respective one of the plurality of light emitting controlling units comprises a plurality of light emitting elements arranged in J rows and I columns, J being an integer equal to or greater than one, I being an integer equal to or greater than one, a i-th column of the I columns of light emitting elements comprises J rows of light emitting elements, $1 \leq i \leq I$;

the method comprises:

electrically connecting first terminals of light emitting elements in a respective row of light emitting elements to a respective first voltage signal line of (M×J) number of first voltage signal lines;

electrically connecting second terminals of light emitting elements in the respective row of light emitting elements to I number of second voltage signal lines in a respective group of second voltage signal lines of (M×J) number of groups of second voltage signal lines;

providing a first voltage signal to the first terminals; and providing a second voltage signal to a respective one of the second terminals;

wherein the respective one of the plurality of light emitting controlling units comprises Q number of groups of light emitting elements, a respective group of the Q number of groups of light emitting elements comprises K columns of light emitting elements, the respective group of second voltage signal lines comprises Q number of sub-groups of second voltage signal lines, a respective sub-group of the Q number of sub-groups of second voltage signal lines comprising K number of second voltage signal lines, Q being an integer equal to or greater than one, K being an integer equal to or greater than one;

the method further comprises:

forming J rows of light emitting elements in a k-th column of the K columns of light emitting elements, $1 \leq k \leq K$, and I=K*Q;

in the respective row of light emitting elements, electrically connecting second terminals of light emitting elements in k-th columns respectively in q-th groups of the Q number of groups of light emitting elements respectively from N number of light emitting controlling units in a same row to a k-th second voltage signal line of the K number of second voltage signal lines in a q-th sub-group of the Q number of sub-groups of second voltage signal lines in the respective group of second voltage signal lines, $1 \leq q \leq Q$; and time-sequentially providing second voltage signals to the K number of second voltage signal lines;

wherein light emitting elements in the k-th column of the K columns of light emitting elements in the Q number of groups of light emitting elements comprise light emitting elements of a same color.

20. A method of fabricating a light emitting substrate, comprising:

forming a plurality of light emitting controlling units arranged in M rows and N columns, M is an integer equal to or greater than one, N is an integer equal to or greater than one, wherein a respective one of the plurality of light emitting controlling units comprises a plurality of light emitting elements arranged in J rows and I columns, J being an integer equal to or greater than one, I being an integer equal to or greater than one, a i-th column of the I columns of light emitting elements comprises J rows of light emitting elements, $1 \leq i \leq I$;

forming (M×J) number of first voltage signal lines; and forming (M×J) number of groups of second voltage signal lines;

wherein forming the plurality of light emitting controlling units comprises:

transferring micro light emitting diodes onto a back panel in which the (M×J) number of first voltage signal lines and the (M×J) number of groups of second voltage signal lines are formed;

electrically connecting first terminals of micro light emitting diodes in a respective row of light emitting elements to a respective first voltage signal line of the (M×J) number of first voltage signal lines; and electrically connecting second terminals of micro light emitting diodes in the respective row of light emitting elements to I number of second voltage signal lines in a respective group of second voltage signal lines of the (M×J) number of groups of second voltage signal lines;

wherein the respective one of the plurality of light emitting controlling units comprises Q number of groups of light emitting elements, Q being an integer equal to or greater than one;

a respective group of the Q number of groups of light emitting elements comprises K columns of light emitting elements, K being an integer equal to or greater than one;

a k-th column of the K columns of light emitting elements comprises J rows of light emitting elements, $1 \leq k \leq K$, and I=K*Q;

the respective group of second voltage signal lines comprises Q number of sub-groups of second voltage signal lines, a respective sub-group of the Q number of sub-groups of second voltage signal lines comprising K number of second voltage signal lines; and in the respective row of light emitting elements, second terminals of light emitting elements in k-th columns respectively in q-th groups of the Q number of groups of light emitting elements respectively from N number of light emitting controlling units in a same row are electrically connected to a k-th second voltage signal line of the K number of second voltage signal lines in a q-th sub-group of the Q number of sub-groups of second voltage signal lines in the respective group of second voltage signal lines, $1 \leq q \leq Q$:

wherein light emitting elements in the k-th column of the K columns of light emitting elements in the Q number of groups of light emitting elements comprise light emitting elements of a same color.

\* \* \* \* \*